(12) United States Patent
Hsu et al.

(10) Patent No.: US 7,390,438 B2
(45) Date of Patent: *Jun. 24, 2008

(54) WATER DISPERSIBLE SUBSTITUTED POLYDIOXYTHIOPHENES MADE WITH FLUORINATED POLYMERIC SULFONIC ACID COLLOIDS

(75) Inventors: Che-Hsiung Hsu, Wilmington, DE (US); Yong Cao, Goleta, CA (US); Sunghan Kim, Goleta, CA (US); Daniel David Lecloux, Buellton, CA (US); Huawen Li, Camarillo, CA (US); Charles Douglas MacPherson, Santa Barbara, CA (US); Chi Zhang, Goleta, CA (US); Hjalti Skulason, Buellton, CA (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 90 days.

This patent is subject to a terminal disclaimer.

(21) Appl. No.: 10/802,704

(22) Filed: Mar. 17, 2004

(65) Prior Publication Data

US 2004/0254297 A1 Dec. 16, 2004

Related U.S. Application Data

(63) Continuation-in-part of application No. 10/669,494, filed on Sep. 24, 2003.

(60) Provisional application No. 60/464,370, filed on Apr. 22, 2003.

(51) Int. Cl.
*H01B 1/12* (2006.01)
(52) U.S. Cl. ............................. 252/500; 528/378
(58) Field of Classification Search ............... 252/500; 549/5; 528/378
See application file for complete search history.

(56) References Cited

U.S. PATENT DOCUMENTS

| 4,552,927 | A |   | 11/1985 | Warren |
| 4,869,979 | A | * | 9/1989 | Ohtani et al. ............... 429/213 |
| 4,889,659 | A |   | 12/1989 | Genies |
| 4,959,430 | A |   | 9/1990 | Jonas et al. |
| 5,247,190 | A |   | 9/1993 | Friend et al. |
| 5,286,413 | A |   | 2/1994 | Hannecart et al. |
| 5,300,575 | A |   | 4/1994 | Jonas et al. |

(Continued)

FOREIGN PATENT DOCUMENTS

EP 0 593 111 A1 4/1994

(Continued)

OTHER PUBLICATIONS

Pickup, Peter G. et al., Electronically conducting cation-exchange polymer powders: synthesis, characterization and applications in PEM fuel cells and supercapacitors, Journal of New Materials for Electrochemical Systems, 2000, 21-26, 3.

(Continued)

*Primary Examiner*—Mark Kopec
(74) *Attorney, Agent, or Firm*—John H. Lamming

(57) ABSTRACT

Compositions are provided comprising aqueous dispersions of polythiophenes having homopolymers or co-polymers of Formula I(a) or Formula I(b) and at least one colloid-forming polymeric acid. Methods of making such compositions and using them in organic electronic devices are further provided.

11 Claims, 15 Drawing Sheets

U.S. PATENT DOCUMENTS

| | | | |
|---|---|---|---|
| 5,317,169 A | 5/1994 | Nakano et al. | |
| 5,378,402 A | 1/1995 | Cross et al. | |
| 5,578,249 A | 11/1996 | Ohtani et al. | |
| 5,705,888 A | 1/1998 | Staring et al. | |
| 5,986,400 A | 11/1999 | Staring et al. | |
| 5,994,496 A | 11/1999 | Van Haare et al. | |
| 6,083,635 A | 7/2000 | Jonas et al. | |
| 6,340,496 B1 | 1/2002 | Cloots et al. | |
| 6,391,481 B1 | 5/2002 | Jonas et al. | |
| 2004/0010115 A1* | 1/2004 | Sotzing | 528/377 |
| 2004/0072987 A1* | 4/2004 | Groenendaal et al. | 528/377 |
| 2004/0102577 A1* | 5/2004 | Hsu et al. | 525/182 |

FOREIGN PATENT DOCUMENTS

| | | |
|---|---|---|
| EP | 0593 111 A1 | 4/1994 |
| EP | 0 440 957 B1 | 3/1996 |
| EP | 0 962 943 A1 | 12/1999 |
| FR | 2 632 979 A1 | 12/1989 |
| GB | 2 124 635 A | 2/1984 |
| JP | 2-160823 | 6/1990 |

OTHER PUBLICATIONS

Lefebvre, Mark et al., Chemical Synthesis, Characterization, and Electrochemical Studies of Poly(3,4-ethylenedioxythiophene)/Poly-(styrene-4-sulfonate) Composites, Chem. Mater., 1999, 262-268, 11, American Chemical Society.

Qi, Zhigang et al., Size Control of Polypyrrole Particles, Chem. Mater., 1997, 2934-2939, 9, American Chemical Society.

Hsu, C. -H., Novel Preparation and Properties of Conductive Polyaniline/Nafion(R) Film, Synthetic Metals, 1991, 671-674, 41-43, Elsevier Sequoia, The Netherlands.

A. J. Sharpe, Jr. et al., Improved Catlonic Conductive Polymer, Calgon Corp., Pittsburgh, PA, Coating Conference [Proceedings], pp. 83-87, 1981, ISSN 0364-2771.

* cited by examiner

WATER DISPERSIBLE SUBSTITUTED POLYDIOXYTHIOPHENES MADE WITH FLUORINATED POLYMERIC SULFONIC ACID COLLOIDS

CROSS REFERENCE TO RELATED APPLICATIONS

This application is a continuation-in-part of application Ser. No. 10/669,494, filed Sep. 24, 2003, and claims priority from U.S. Provisional Application No. 60/464,370, filed Apr. 22, 2003.

FIELD OF THE INVENTION

The invention relates to aqueous dispersions of electrically conducting polymers of thiophene, wherein the electrically conducting polymer is synthesized in the presence of polymeric acid colloids.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly (styrenesulfonic acid) (PSS), as described in, for example, U.S. Pat. No. 5,300,575 entitled "Polythiophene dispersions, their production and their use." A well known PEDT/PSS material is Baytron®-P, commercially available from H. C. Starck, GmbH (Leverkusen, Germany).

The aqueous electrically conductive polymer dispersions synthesized with water soluble polymeric sulfonic acids have undesirable low pH levels. The low pH can contribute to decreased stress life of an EL device containing such a buffer layer, and contribute to corrosion within the device. Accordingly, there is a need for compositions and layers prepared there from having improved properties.

Electrically conducting polymers which have the ability to carry a high current when subjected to a low electrical voltage, also have utility as electrodes for electronic devices, such as thin film field effect transistors. In such transistors, an organic semiconducting film which has high mobility for electron and/or hole charge carriers, is present between source and drain electrodes. A gate electrode is on the opposite side of the emiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers. The electrical conductivity of the electrodes fabricated from the electrically conducting polymers should be greater than 10 S/cm (where S is a reciprocal ohm). However, the electrically conducting polythiophenes made with a polymeric acid typically provide conductivity in the range of $\sim 10^{-3}$ S/cm or lower. In order to enhance conductivity, conductive additives may be added to the polymer. However, the presence of such additives can deleteriously affect the processability of the electrically conducting polythiophene. Accordingly, there is a need for improved conductive polythiophenes.

SUMMARY OF THE INVENTION

New compositions are provided comprising aqueous dispersions of at least one polythiophene and at least one colloid-forming polymeric acid, wherein the polythiophene comprises the Formula I(a) or I(b):

wherein
with respect to Formula I(a):

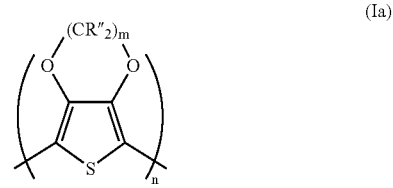

(Ia)

R" is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, and urethane, with the proviso that at least one R" is not hydrogen.
m is 2 or 3, and
n is at least about 4;
and, with respect to Formula I(b):

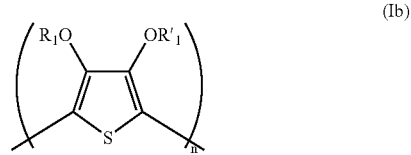

(Ib)

$R'_1$ and $R_1$ are independently selected from hydrogen or alkyl, or
$R'_1$ and $R_1$ taken together form an alkylene chain having 1 to 4 carbon atoms, which may optionally be substituted by alkyl or aromatic groups having 1 to 12 carbon atoms, or a 1,2-cyclohexylene radical, and
n is at least about 4.

In another embodiment, there are provided methods for synthesizing aqueous dispersions of at least one polythiophene comprising at least one of the Formula I(a) or Formula I(b) and at least one colloid-forming polymeric acid. One method of producing an aqueous dispersion of the polythiophene and at least one colloid-forming polymeric acid, comprises:

(a) providing a homogeneous aqueous mixture of water and at least one thiophene monomer, said thiophene having Formula II(a) or II(b):

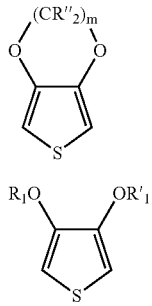

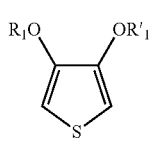

wherein R", R'$_1$, and R$_1$ and m are as defined above;
(b) providing an aqueous dispersion of the colloid-forming polymeric acid;
(c) combining the thiophene mixture with the aqueous dispersion of the colloid-forming polymeric acid, and
(d) combining an oxidizing agent and a catalyst, in any order, with the aqueous dispersion of the colloid-forming polymeric acid before or after the combining of step (c).

In another embodiment, new compositions are provided comprising at least one polythiophene, at least one colloid-forming polymeric acid, and at least one co-dispersing liquid, wherein the polythiophene comprises the Formula I(a) or I(b), as described above.

In another embodiment, electronic devices comprising at least one layer comprising the new composition are provided.

The foregoing general description and the following detailed description are exemplary and explanatory only and are not restrictive of the invention, as defined in the appended claims.

BRIEF DESCRIPTION OF THE FIGURES

The invention is illustrated by way of example and not limited in the accompanying figures.

DETAILED DESCRIPTION OF THE INVENTION

Figure 1:
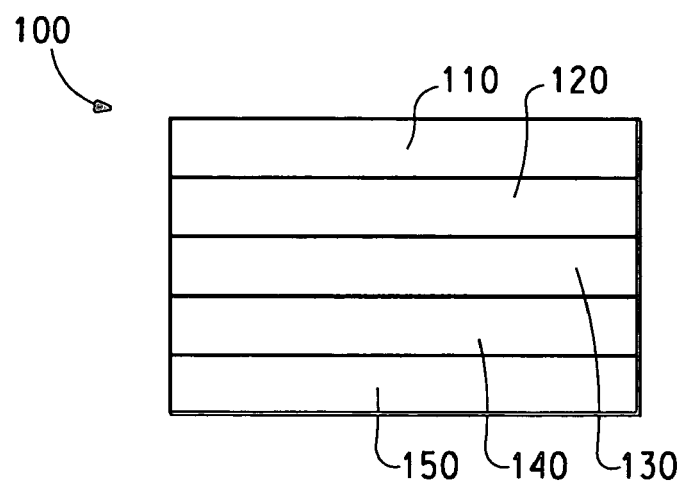
FIG. 1 illustrates a cross-sectional view of an electronic device that comprises a buffer layer comprising one embodiment of the new composition.

In one embodiment, compositions are provided comprising aqueous dispersions of at least one polythiophenes having Formula I(a) or Formula I(b), and at least one colloid-forming polymeric acid.

The new aqueous dispersion of at least one polythiophene and at least one colloid-forming polymeric acid comprising at least one polythiophene having Formula I(a) or Formula I(b) can be prepared when at least one thiophene monomer having Formula II(a) or II(b) are polymerized chemically in the presence of colloid-forming polymeric acids.

Further, it has been discovered that use of a polymeric acid that is not water soluble in preparation of an aqueous dispersion of the polythiophenes having Formula II(a) or Formula II(b) yields a composition with superior electrical properties. In one embodiment, the aqueous dispersions of the new composition comprises electrically conductive minute particles that are stable in the aqueous medium without forming a separate phase over a long period of time before a use. In one embodiment, layers comprising the new composition do not re-disperse once dried into films or layers during fabrication of the electronic device.

Compositions according to one embodiment of the new composition comprise a continuous aqueous phase in which at least one polythiophene and at least one colloid-forming polymeric acid are dispersed.

Polythiophenes contemplated for use in the new composition are made from at least one monomer having the following Formulae II(a) or II(b) to create either homopolymers or co-polymers, wherein:

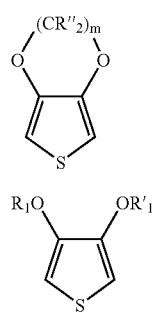

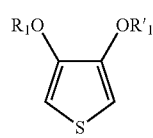

R" is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, sulfonate, and urethane, with the proviso that at least one R" is not hydrogen;

R'$_1$ and R$_1$ are independently selected from hydrogen or alkyl, or R$_1$ and R$_1$' taken together form an alkylene chain having 1 to 4 carbon atoms, which may optionally be substituted by alkyl or aromatic groups having 1 to 12 carbon atoms, or a 1,2-cyclohexylene radical.

Thiophenes of the new composition have the same general structure as provided above, wherein $R_1$ and $R_1'$ are substituted for the "$OR_1$" and "$OR_1'$" substituents.

The polythiophenes of the new composition can be homopolymers, or they can be copolymers of two or more thiophene monomers. The aqueous dispersions of polythiophene and colloid-forming polymeric acid can comprise one or more than one polythiophene polymer and one or more than one colloid-forming polymeric acid.

As used herein, the term "dispersion" refers to a continuous liquid medium containing a suspension of minute particles. The "continuous medium" comprises an aqueous liquid. As used herein, the term "aqueous" refers to a liquid that has a significant portion of water and in one embodiment it is at least about 40% by weight water. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble.

As used herein, the term "co-dispersing liquid" refers to a substance which is liquid at room temperature and is miscible with water. As used herein, the term "miscible" means that the co-dispersing liquid is capable of being mixed with water (at concentrations set forth herein for each particular co-dispersing liquid) to form a substantially homogeneous solution.

The term "layer" or "film" refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —$R^3$—OH amidosulfonate —$R^3$—C(O)N($R^6$)$R^4$—$SO_3Z$

"benzyl" —$CH_2$—$C_6H_5$

"carboxylate" —$R^3$—C(O)O—Z

"ether" —$R^3$—O—$R^5$

"ether carboxylate" —$R^3$—O—$R^4$—C(O)O—Z

"ether sulfonate" —$R^3$—O—$R^4$—$SO_3Z$

"sulfonate" —$R^3$—$SO_3Z$

"urethane" —$R^3$—O—C(O)—N($R^6$)$_2$ where all "R" groups are the same or different at each occurrence and:
$R^3$ is a single bond or an alkylene group
$R^4$ is an alkylene group
$R^5$ is an alkyl group
$R^6$ is hydrogen or an alkyl group
Z is H, alkali metal, alkaline earth metal, N($R^5$)$_4$ or $R^5$.

Any of the above groups may further be unsubstituted or substituted, and any group may have F substituted for one or more hydrogens, including perfluorinated groups.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

In one embodiment, the polythiophene has Formula I(a) where m is two, one R" is an alkyl group of more than 5 carbon atoms, and all other R" are hydrogen.

In one embodiment of Formula I(a), at least one R" group has at least one fluorine substituent.

In one embodiment of Formula I(a), the R" substituents on the fused alicyclic ring on the thiophene should offer improved solubility of the monomers in water and facilitate polymerization in the presence of the polymeric acid colloids. In another embodiment, the resulting polythiophene/colloidal polymeric acid composition has reduced particle size and dispersion stability.

In one embodiment, the polythiophene is a poly[(sulfonic acid-propylene-ether-methylene-3,4-dioxyethylene) thiophene]. In one embodiment, the polythiophene is a poly [(propyl-ether-ethylene-3,4-dioxyethylene)thiophene].

In one embodiment, the polythiophene has Formula I(b) where $R_1$ and $R_1'$ taken together form an alkylene chain having 1 to 4 carbon atoms. In another embodiment, the polydioxythiophene is poly(3,4-ethylenedioxythiophene).

Colloid-forming polymeric acids contemplated for use in the new compositions are insoluble in water, and form colloids when dispersed into an aqueous medium. The polymeric acids typically have a molecular weight in the range of about 10,000 to about 4,000,000.

In one embodiment, the polymeric acids have a molecular weight of about 100,000 to about 2,000,000. Polymeric acid colloid particle size typically ranges from 2 nanometers (nm)

to about 140 nm. In one embodiment, the colloids have a particle size of 2 nm to about 30 nm.

Any polymeric acid that is colloid-forming when dispersed in water is suitable for use to make the new compositions. In one embodiment, the colloid-forming polymeric acid comprises at least one polymeric acid selected form polymer sulfonic acid, polymeric phosphoric acids, polymeric phosphonic acids, polymeric carboxylic acids, and polymeric acrylic acids, and mixtures thereof. In another embodiment, the polymeric sulfonic acid is fluorinated. In still another embodiment, the colloid-forming polymeric sulfonic acid is perfluorinated. In yet another embodiment, the colloid-forming polymeric sulfonic acid comprises a perfluoroalkylene-sulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, one other monomer includes fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the co-monomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the new composition include a highly fluorinated, and in one embodiment perfluorinated, carbon backbone and side chains represented by the formula

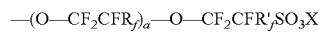

wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and are and in one embodiment H, $CH_3$ or $C_2H_5$. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

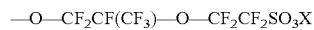

where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3X$, wherein X is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

In one embodiment, the FSA polymers for use in the new composition typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—$CF(CF_3)$—O—$CF_2$—$CF_2$—$SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—$CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The synthesis of FSA polymers is well known. The FSA polymers can be prepared as colloidal aqueous dispersions.

They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous dispersions. After the dispersion is made, the concentration and the dispersing liquid composition can be adjusted by methods known in the art.

In one embodiment, aqueous dispersions of the colloid-forming polymeric acids, including FSA polymers, have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

In one embodiment, the thiophene monomers having Formula II(a) or Formula II(b) are oxidatively polymerized in water comprising at least one polymeric acid colloids. Typically, the thiophene monomers are combined with or added to an aqueous dispersion containing a polymerization catalyst, an oxidizing agent, and colloidal polymeric acid particles dispersed therein. In this embodiment, the order of combination or addition may vary provided that when the oxidizing agent and catalyst is combined with the monomers at least a portion of the colloid-forming polymeric acid is present. In one embodiment, the reaction mixture may further comprise a co-dispersing agent, a co-acid, or mixtures thereof.

In one embodiment, the colloid-forming polymeric acid is an FSA, and co-dispersing liquid of the aqueous FSA dispersion is optionally removed prior to or after polymerization of thiophene monomers.

In one embodiment, the thiophene monomers are combined with the aqueous reaction mixture comprising colloid-forming polymeric acid particles, the oxidizing agent and the catalyst by dispensing the thiophene monomer in a controlled rate of addition while continuously mixing the reaction mixture to form a monomer-meniscus in the reaction mixture.

In one embodiment, the oxidizing agent predissolved in water is combined with the aqueous reaction mixture comprising colloid-forming polymeric acid particles, thiophene monomer and the catalyst therein by dispensing the oxidizing agent solution in a controlled rate of addition while continuously mixing the reaction mixture.

In one embodiment, the oxidizing agent and the thiophene monomer are added separately and simultaneously to the reaction mixture, at the same or different controlled rates of addition, to achieve the final desired quantity of oxidizing agent, so as to consume the monomer at a controlled rate in the oxidative polymerization reaction.

In one embodiment, the controlled rate of addition of thiophene monomer is determined in view of the quantity of materials used, with the goal of controlling the rate of monomer addition from the dispensing mechanism to ensure dissolution in the reaction mixture quickly. With the controlled addition, the polymerization and oxidation chemistry take place in an even and uniform manner. Examples of the dispensing mechanism include, but are not limited to, use of tubing, syringes, pipettes, nozzle guns, sprayers, hoses, pipes and the like. In one embodiment, a perforated end, such as a fritted-glass plate, or small diameter tubing attached to the equipment described above is used for creating a monomer-meniscus in the reaction mixture.

The rate of addition depends upon the size of the reaction, the speed at which the solution is stirred and the geometry and number of the dispensing ends of the dispensing mechanism orifice. In one embodiment, the dispensing end of the dispensing mechanism is submerged in the reaction mixture containing the aqueous colloid-forming polymeric acid. For example, addition rates of thiophene monomer of about 1-1000 micro liter per hour for a reaction mixture size of about 100-500 grams of aqueous colloid-forming polymeric acid composition can be used. In one embodiment the rate of addition is between about 5 and 100 micro liters per hour for about 500 grams of the aqueous colloid-forming polymeric acid. For reaction mixtures of other sizes (larger or smaller), the rate of addition can be linearly scaled in the appropriate direction.

In one embodiment, at least one co-dispersing liquid is added to the reaction mixture prior to termination of the polymerization of the thiophene monomers. In another embodiment, at least one co-dispersing liquid is added to the reaction mixture after the termination of the polymerization of the thiophene. In another embodiment, a portion of at least one co-dispersing liquid is added prior to termination of the thiophene polymerization and an additional quantity of at least one co-dispersing liquid is added after termination of the polymerization of the thiophene.

Polymerization catalysts include, but are not limited to, ferric sulfate, ferric chloride, other materials having a higher oxidation potential than the oxidizing agent, and mixtures thereof.

Oxidizing agents include, but are not limited to, sodium persulfate, potassium persulfate, ammonium persulfate, and the like, including combinations thereof. In one embodiment, the oxidative polymerization results in a stable, aqueous dispersion containing positively charged conductive polymeric thiophene that is charge balanced by the negatively charged side chains of the polymeric acids contained within the colloids, for example, sulfonate anion, carboxylate anion, acetylate anion, phosphorate anion, phosphonate anion, combinations, and the like.

In one embodiment, the method of making the new composition comprising at least one polythiophene having Formula I(a) or Formula I(b) and at least one colloid-forming polymer acid includes: (a) providing an aqueous dispersion of a polymer acid; (b) adding an oxidizing agent to the dispersion of step (a); (c) adding a catalyst to the dispersion of step (b); and (d) adding a thiophene monomer to the dispersion of step (c). One alternative embodiment to the above described method includes adding the thiophene monomer to the aqueous dispersion of a polymeric acid prior to adding the oxidizing agent. Another embodiment is to create a homogenous aqueous mixture of water and the thiophene having Formula II(a) or Formula II(b), with concentrations which typically are in the range of about 0.5% by weight to about 2.0% by weight thiophene, and add this thiophene mixture to the aqueous dispersion of the polymeric acid before adding the oxidizing agent and catalyst.

The polymerization can be carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, and combinations thereof. In one embodiment, the amount of co-dispersing liquid should be less than about 30% by volume. In one embodiment, the amount of co-dispersing liquid is less than about 60% by volume. In one embodiment, the amount of co-dispersing liquid is between about 5% to 50% by volume. In one embodiment, the co-dispersing liquid comprises an alcohol. In one embodiment, the co-dispersing liquid comprises at least one from n-propanol, isopropanol, t-butanol, methanol dimethylacetamide, dimethylformamide, N-methylpyrrolidone.

The polymerization can be carried out in the presence of a co-acid. The acid can be an inorganic acid, such as HCl, sulfuric acid, and the like, or an organic acid, such as p-toluenesulfonic acid, dodecylbenzenesulfonic acid, methanesulfonic acid, trifluoromethanesulfonic acid, camphorsulfonic acid, acetic acid and the like. Alternatively, the co-acid can be a water soluble polymeric acid such as poly(styrenesulfonic acid), poly(2-acrylamido-2-methyl-1-propanesulfonic acid, or the like, or a second colloid-forming acid, as described above. Combinations of co-acids can be used.

The co-acid can be added to the reaction mixture at any point in the process prior to the addition of either the oxidizing agent or the thiophene monomer, whichever is added last. In one embodiment, the co-acid is added before both the thiophene monomer and the colloid-forming polymeric acid, and the oxidizing agent is added last. In one embodiment the co-acid is added prior to the addition of the thiophene monomer, followed by the addition of the colloid-forming polymeric acid, and the oxidizing agent is added last.

The co-dispersing liquid can be added to the reaction mixture at any point before, during or after the thiophene polymerization.

In one embodiment, compositions are provided comprising aqueous dispersions of polydioxythiophenes, colloid-forming polymeric acids, and at least one co-dispersing liquid. The addition of at least one co-dispersing liquid to aqueous dispersions of poly(dioxythiophenes) and colloid-forming polymeric acids after polymerization can result in polymer dispersions having better wettability, and processability, processable viscosity, a substantially reduced number of large particles, improved stability of the dispersion, improved ink-jetability, enhanced conductivity, or combinations thereof. Surprisingly, it has been discovered that OLED devices having buffer layers made from such dispersions also have higher efficiencies and longer lifetimes.

Co-dispersing liquids contemplated for use in the new composition are generally polar, water-miscible organic liquids. Examples of suitable types of co-dispersing liquids include, but are not limited to, ethers, cyclic ethers, alcohols, alcohol ethers, ketones, nitriles, sulfides, sulfoxides, amides, amines, carboxylic acids, and the like, as well as combinations of any two or more thereof.

Exemplary ether co-dispersing liquids contemplated for use in the new composition include, but are not limited to, diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, and the like, as well as combinations of any two or more thereof.

Exemplary cyclic ether co-dispersing liquids contemplated for use in the new composition include, but are not limited to, 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, and the like, as well as combinations of any two or more thereof. In one embodiment, the cyclic ether co-dispersing liquid is tetrahydrofuran, tetrahydropyran, or 1,4-dioxane.

Exemplary alcohol co-dispersing liquids contemplated for use in the new composition include, but are not limited to, methanol, ethanol, 1-propanol, 2-propanol (i.e., isopropanol), 1-butanol, 2-butanol, 2-methyl-1-propanol (i.e., isobutanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, and the like, as well as combinations of any two or more thereof. In one embodiment, the alcohol co-dispersing liquid is methanol, ethanol, or isopropanol.

Exemplary alcohol ether co-dispersing liquids contemplated for use in the new composition include, but are not limited to, 2-butoxyethanol, 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, and the like, as well as combinations of any two or more thereof. In one embodiment, the alcohol ether co-dispersing liquid is 1-methoxy-2-propanol, 2-methoxyethanol, or 2-butoxyethanol.

Exemplary ketone co-dispersing liquids contemplated for use in the new composition include, but are not limited to, acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, and the like, as well as combinations of any two or more thereof.

Exemplary nitrile co-dispersing liquids contemplated for use in the new composition include, but are not limited to, acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, n-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, and the like, as well as combinations of any two or more thereof.

Exemplary sulfoxide co-dispersing liquids contemplated for use in the new composition include, but are not limited to, dimethyl sulfoxide (DMSO), di-n-butyl sulfoxide, tetramethylene sulfoxide, methyl phenyl sulfoxide, and the like, as well as combinations of any two or more thereof.

Exemplary amide co-dispersing liquids contemplated for use in the new composition include, but are not limited to, dimethyl formamide (DMF), dimethyl acetamide, acylamide, 2-acetamidoethanol, N,N-dimethyl-m-toluamide, trifluoroacetamide, N,N-dimethylacetamide, N,N-diethyldodecanamide, ε-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, and the like, as well as combinations of any two or more thereof.

Exemplary amine co-dispersing liquids contemplated for use in the new composition include, but are not limited to, mono-, di-, and tri-alkyl amines, cyclic amines (such as, e.g., pyrrolidine), aromatic amines (such as, e.g., pyridine) and the like, as well as combinations of any two or more thereof. In one embodiment, the amine co-dispersing liquid is pyridine.

Exemplary carboxylic acid co-dispersing liquids contemplated for use in the new composition include, but are not limited to, $C_1$ up to about $C_6$ straight or branched chain carboxylic acids, as well as combinations of any two or more thereof. In one embodiment, the carboxylic acid co-dispersing liquid is formic acid.

In one embodiment, the co-dispersing liquid comprises a liquid selected from, n-propanol, isopropanol, methanol, butanol, 1-methoxy-2-propanol, dimethylacetamide, n-methyl pryrozole, 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, 1-methylpyrrolindine, 1-methyl-2-pyrrolidinone, dimethylsulfoxide, and combinations of any two or more thereof.

In one embodiment, after completion of any of the methods described above and completion of the polymerization reaction, the as-synthesized aqueous dispersion is contacted with at least one ion exchange resin under conditions suitable to remove decomposed species, side reaction products, unreacted monomers, and ionic impurities, and to adjust pH. The as-synthesized aqueous dispersion can be contacted with at least one ion exchange resin before or after the addition of a co-dispersing liquid. In one embodiment, the as-synthesized aqueous dispersion is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the new process. In one embodiment, the acidic, cation exchange resin is an organic acid, cation exchange resin, such as a sulfonic acid cation exchange resin. Sulfonic acid cation exchange resins contemplated for use in the new composition include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, or the like.

In another embodiment, the basic, anionic exchange resin is a tertiary amine anion exchange resin. Tertiary amine anion exchange resins contemplated for use in the new compositions include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, at least 1 gram of ion exchange is used per about 1 gram of colloid-forming polymeric acid. In other embodiments, the use of the ion exchange resin is used in a ratio of up to about 5 grams of ion exchange resin to polythiophene/polymeric acid colloid and depends on the pH that is to be achieved. In one embodiment, about one gram of Lewatit® MP62 WS, a weakly basic anion exchange resin from Bayer GmbH, and about one gram of Lewatit® Mono-Plus S100, a strongly acidic, sodium cation exchange resin from Bayer, GmbH, are used per gram of the composition of polythiophene having Formula I(a) or Formula I(b) and at least one colloid-forming polymeric acid.

In one embodiment, the aqueous dispersion resulting from polymerization of thiophene having Formula II(a) or Formula II(b) with fluorinated polymeric sulfonic acid colloids is to charge a reaction vessel first with an aqueous dispersion of the fluorinated polymer, and then, in order, add the oxidizing agent, catalyst and thiophene monomer; or, in order, the thiophene monomer, the oxidizing agent and catalyst to the aqueous dispersion of the colloid-forming polymeric acid. The mixture is stirred and the reaction is then allowed to proceed at a controlled temperature. When polymerization is completed, the reaction is quenched with a strong acid cation resin and a base anion exchange resin, stirred and filtered. Alternatively, the thiophene having Formula II(a) or Formula II(b) can be added to water and stirred to homogenize the mixture prior to addition of Nafion® dispersion, followed with oxidizing agent and catalyst. The oxidizing agent:monomer ratio is generally in the range of 0.5 to 2.0. The fluorinated polymer:thiophene monomer ratio is generally in the range of 1 to 4. The overall solid content is generally in the range of 1.5% to 6%; and in one embodiment 2% to 4.5%. The reaction temperature is generally in the range of 5° C. to 50° C.; and in one embodiment 20° C. to 35° C. The reaction time is generally in the range of 1 to 30 hours.

Aqueous dispersions of polythiophenes of Formula I(a) or Formula I(b) and polymer acid colloids can have a wide range of pH and can be adjusted to typically be between about 1 to about 8, and generally have a pH of about 3-4. It is frequently desirable to have a higher pH, as the acidity can be corrosive. It has been found that the pH can be adjusted using known techniques, for example, ion exchange or by titration with an aqueous basic solution.

In another embodiment, more conductive dispersions are formed by the addition of highly conductive additives to the aqueous dispersions of polythiophene having Formula I(a) or Formula I(b) and the colloid-forming polymeric acid. In one embodiment, new compositions with relatively high pH can be formed, and further comprise the conductive additives, especially metal additives, which are not attacked by the acid in the dispersion. Moreover, because the polymeric acids are colloidal in nature, having the surfaces predominately containing acid groups, electrically conducting polythiophene is formed on the colloidal surfaces.

In one embodiment, the new composition further comprises at least one conductive additive at a weight percentage of an amount to reach the percolation threshold. Examples of suitable conductive additives include, but are not limited to conductive polymers, metal particles and nanoparticles, metal nanowires, carbon nanotubes, carbon nanopoarticles, graphite fibers or particles, carbon particles, and combinations thereof. A dispersing agent may be included to faciltate dispersing of the conductive additives.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

In one embodiment, there are provided buffer layers deposited from an aqueous dispersion containing polythiophene having Formula I(a) or Formula I(b) and fluorinated polymeric acid colloids. In another embodiment, the fluorinated polymeric acid colloids are fluorinated polymeric sulfonic acid colloids. In still another embodiment, the buffer layer is deposited from an aqueous dispersion containing polythiophene having Formula I(a) or Formula I(b) and perfluoroethylenesulfonic acid colloids.

In another embodiment, there are provided buffer layers deposited from aqueous dispersions comprising at least one polythiophene having Formula I(a) or Formula I(b), at least one colloid-forming polymeric acid, and at least one co-dispersing liquid. In one embodiment, the co-dispersing liquid is selected from n-propanol, isopropanol, t-butanol, methanol dimethylacetamide, dimethylformamide, N-methylpyrrolidone, ethylene glycol, and mixtures thereof.

In one embodiment, the dried layers of polythiophenes having Formula I(a) or Formula I(b) and polymeric acid colloids, such as fluorinated polymeric sulfonic acid colloids, are not redispersible in water. In one embodiment, the organic device comprising at least one layer comprising the new composition is made of multiple thin layers. In one embodiment, the layer can be further overcoated with a layer of different water-soluble or water-dispersible material without substantial damage to the layer's functionality or performance in an organic electronic device.

In another embodiment, there are provided buffer layers deposited from aqueous dispersions comprising at least one polythiophene having Formula I(a) or Formula I(b) and at least one colloid-forming polymeric acids blended with other water soluble or dispersible materials. Depending on the final application of the material, examples of types of additional water soluble or dispersible materials which can be added include, but are not limited to polymers, dyes, coating aids, carbon nanotubes, metal nanowires and nanoparticles, organic and inorganic conductive inks and pastes, charge transport materials, piezoelectric, pyroelectric, or ferroelectric oxide nano-particles or polymers, photoconductive oxide nanoparticles or polymers, dispersing agents, crosslinking agents, and combinations thereof. The materials can be simple molecules or polymers. Examples of suitable other water soluble or dispersible polymers include, but are not limited to, polyacrylamide, polyvinylalcohol, poly(2-vinylpridine), poly(vinylacetate), poly(vinylmethylether), poly(vinylpyrrolidone), poly(vinylbutyral), poly(styrenesulfonic acid, and conductive polymers such as polythiophenes, polyanilines, polyamines, polypyrroles, polyacetylenes, colloid-forming polymeric acids, and combinations thereof.

In another embodiment, there are provided electronic devices comprising at least one electrically conductive or semiconductive layer made from the new composition. Organic electronic devices that may benefit from having one or more layers comprising the composition of at least one polythiophene having Formula I(a) or Formula I(b), and at least one colloid-forming polymeric acids and include, but are not limited to, (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semiconductor layers (e.g., a transistor or diode). Other uses for the new compositions include coating materials for memory storage devices, antistatic films, biosensors, electrochromic devices, solid electrolyte capacitors, energy storage devices such as a rechargeable battery, and electromagnetic shielding applications.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 can be deposited onto substrates using any techniques well-known to those skilled in the art.

The electroluminescent (EL) layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors.

The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In one embodiment, OLEDs comprising at least one buffer layer deposited from aqueous dispersions comprising at least one polythiophenes having Formula I(a) or Formula I(b) and at least one colloid-forming polymeric acids have been found to have improved lifetimes. The buffer layer may be deposited from an aqueous dispersion of polythiophene having Formula I(a) or Formula I(b) and fluorinated polymeric sulfonic acid colloids; in one embodiment the buffer layer is depositing using any solution processing technique and is an aqueous dispersion in which the pH has been adjusted to above about 3.5.

In one embodiment a pH neutral composition is used in at least one layer of an electronic device. In one OLED embodiment, the pH is adjusted so as to reduce etching of the ITO layer during device fabrication and hence much lower concentration of In and Sn ions diffusing into the polymer layers of the OLED. Since In and Sn ions are suspected to contribute to reduced operating lifetime this is a significant benefit. The lower acidity also reduces corrosion of the metal components of the display (e.g. electrical contact pads) during fabrication and over the long-term storage. PEDT/PSSA residues will interact with residual moisture to release acid into the displays with resulting slow corrosion.

Equipment used to dispense the acidic PEDT/PSSA needs to be specially designed to handle the strong acidity of PEDT/PSSA. For example, a chrome-plated slot-die coating-head used to coat the PEDT/PSSA onto ITO substrates was found to be corroding due to the acidity of the PEDT/PSSA. This rendered the head unusable since the coated film became contaminated with particles of chrome. Also, certain ink-jet print heads are of interest for the fabrication of OLED displays. They are used for dispensing both the buffer layer and the light-emitting polymer layer in precise locations on the display. These print-heads contain nickel mesh filters as an internal trap for particles in the ink. These nickel filters are decomposed by the acidic PEDT/PSSA and rendered unusable. Neither of these corrosion problems will occur with the aqueous polythiophene dispersions of the new compositions in which the acidity has been lowered.

Furthermore, certain light-emitting polymers are found to be sensitive to acidic conditions, and their light-emitting capability is degraded if they are in contact with an acidic buffer layer. It is advantageous to use the aqueous dispersions of the new compositions to form the buffer layer because the ability to adjust pH to a lower acidity or neutrality.

In one embodiment the fabrication of full-color or area-color displays using two or more different light-emitting materials becomes complicated if each light-emitting material requires a different cathode material to optimize its performance. Display devices are made up of a multiplicity of pixels which emit light. In multicolor devices there are at least two different types of pixels (sometimes referred to as sub-pixels) emitting light of different colors. The sub-pixels are constructed with different light-emitting materials. It is very desirable to have a single cathode material that gives good device performance with all of the light emitters. This minimizes the complexity of the device fabrication. When the buffer layer is made from the aqueous polythiophene dispersions of the new composition, It may be possible to use a common cathode in multicolor devices while maintaining good device performance for each of the colors. The cathode can be made from any of the materials discussed above; and may be barium, overcoated with a more inert metal such as aluminum.

The layer in an organic electronic device comprising the new composition may further comprise a layer of conductive polymer applied from aqueous solution or solvent. The conductive polymer can facilitate charge transfer and also improve coatability. Examples of suitable conductive polymers include, but are not limited to, polyanilines, polythiophenes, polydioxythiophene/polystyrenesulfonic acid, polyaniline/polymeric-acid-colloids such as those disclosed in co-pending application Ser. No. 10/669,577, polythiophene/polymeric-acid-colloids such as those disclosed in co-pending application Ser. No. 10/669,494, polypyrroles, polyacetylenes, and combinations thereof. The composition comprising such a layer may further comprise conductive polymers, and may also comprise dyes, carbon nanotubes, carbon nanoparticles, metal nanowires, metal nanoparticles, carbon fibers and particles, graphite fibers and particles, coating aids, organic and inorganic conductive inks and pastes, charge transport materials, semiconductive or insulating inorganic oxide particles, piezoelectric, pyroelectric, or ferroelectric oxide nano-particles or polymers, photoconductive oxide nanoparticles or polymers, dispersing agents, crosslinking agents and combinations thereof. These materials can be added to the new composition either before or after polymerization of the monomer and/or before or after treatment with at least one ion exchange resin.

In one embodiment, there are provided thin film field effect transistors comprising electrodes comprising polythiophenes comprising at least one of the Formula I(a) or Formula I(b) and at least one colloid-forming polymeric sulfonic acid. For use as electrodes in thin film field effect transistors, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of $\sim 10^{-3}$ S/cm or lower. Thus, in one embodiment, the electrodes comprise polythiophene comprising at least one of the Formula I(a) or Formula I(b) and fluorinated colloid-forming polymeric sulfonic acids in combination with electrical conductivity enhancers such as metal nanowires, metal nanoparticles, carbon nanotubes, or the like. The new compositions may be used in thin film field effect transistors as gate electrodes, drain electrodes, or source electrodes.

Figure 2:
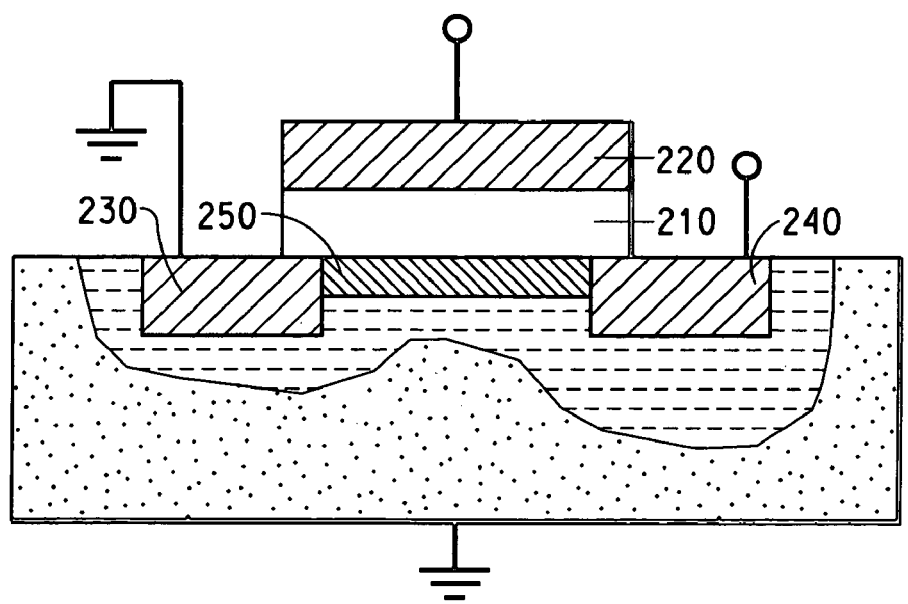
FIG. 2 illustrates a cross-sectional view of a thin film field effect transistor that comprises an electrode comprising the new composition.
Figure 3:
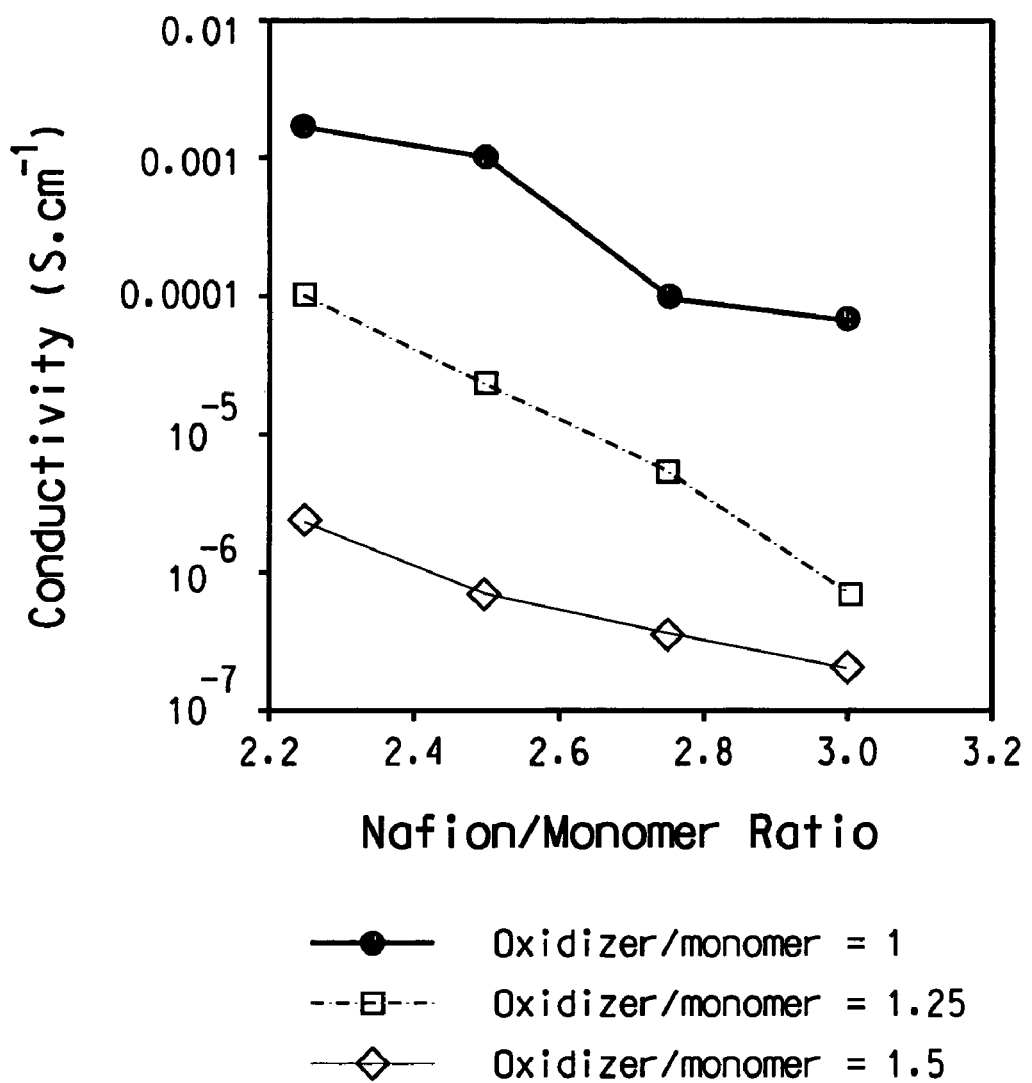
FIG. 3 illustrates the change in conductivity of polythiophene/FSA aqueous colloidal dispersion® films with the ratio of oxidizing agent to monomer in the polymerization reaction.
Figure 4:
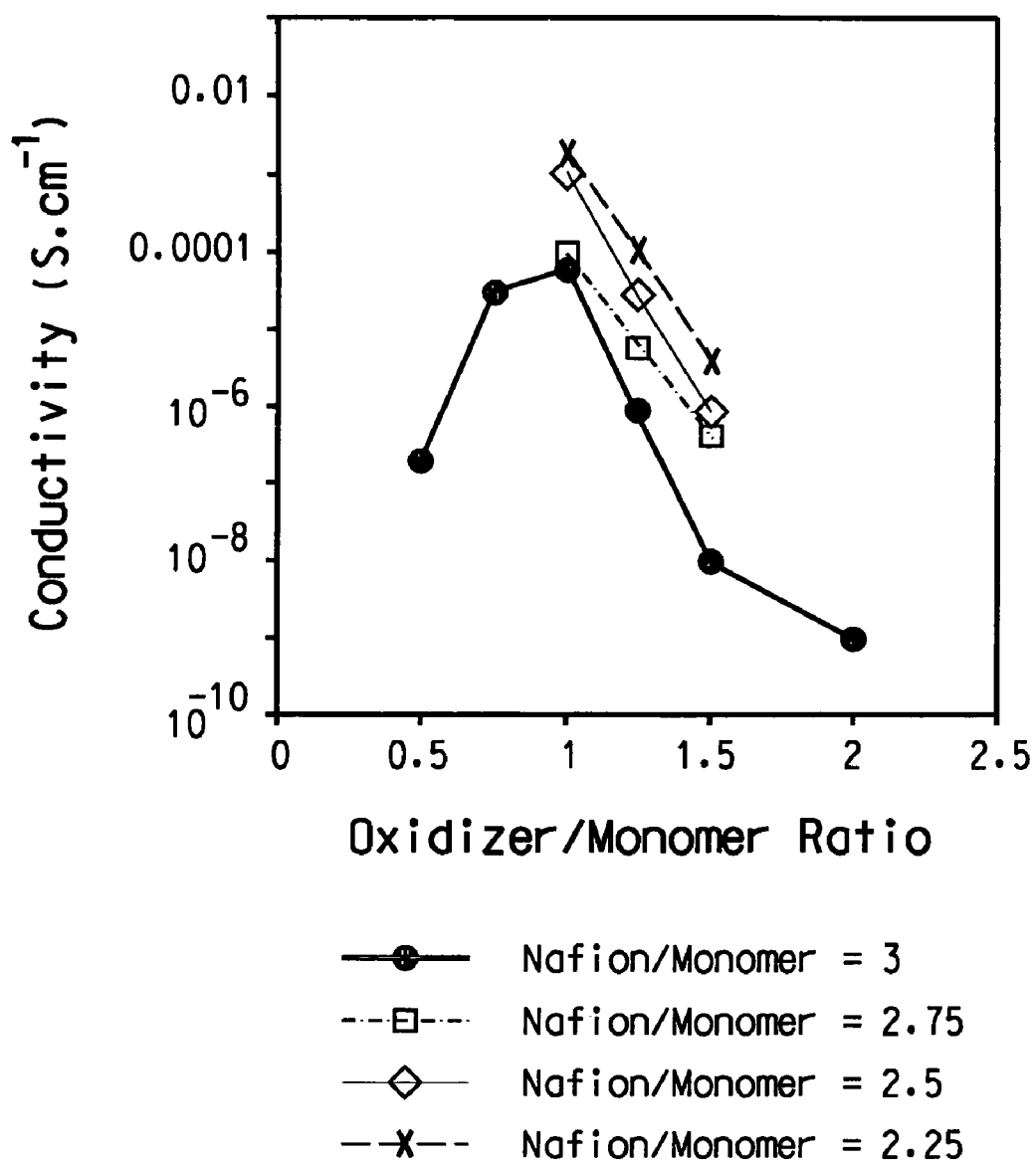
FIG. 4 illustrates the change in conductivity of polythiophene/FSA aqueous colloidal dispersion films with the ratio of FSA to monomer in the polymerization reaction.
Figure 5:
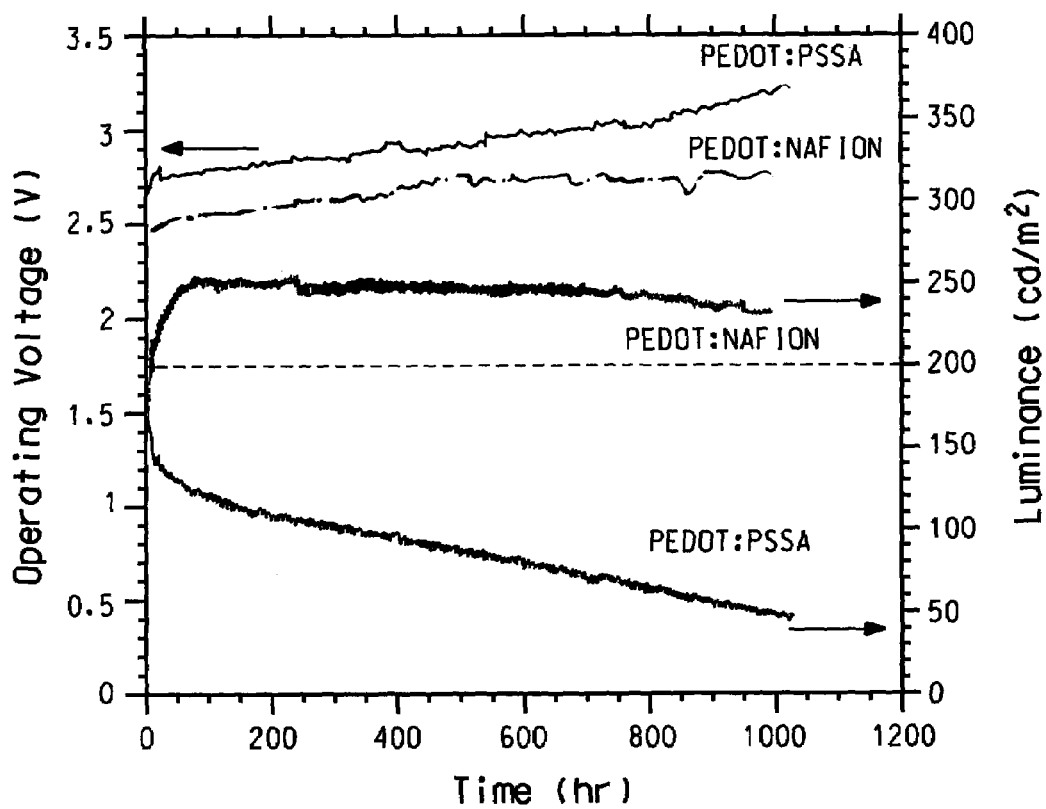
FIG. 5 illustrates the operation lifetime of OLED devices with green light-emitting polymers.
Figure 6:
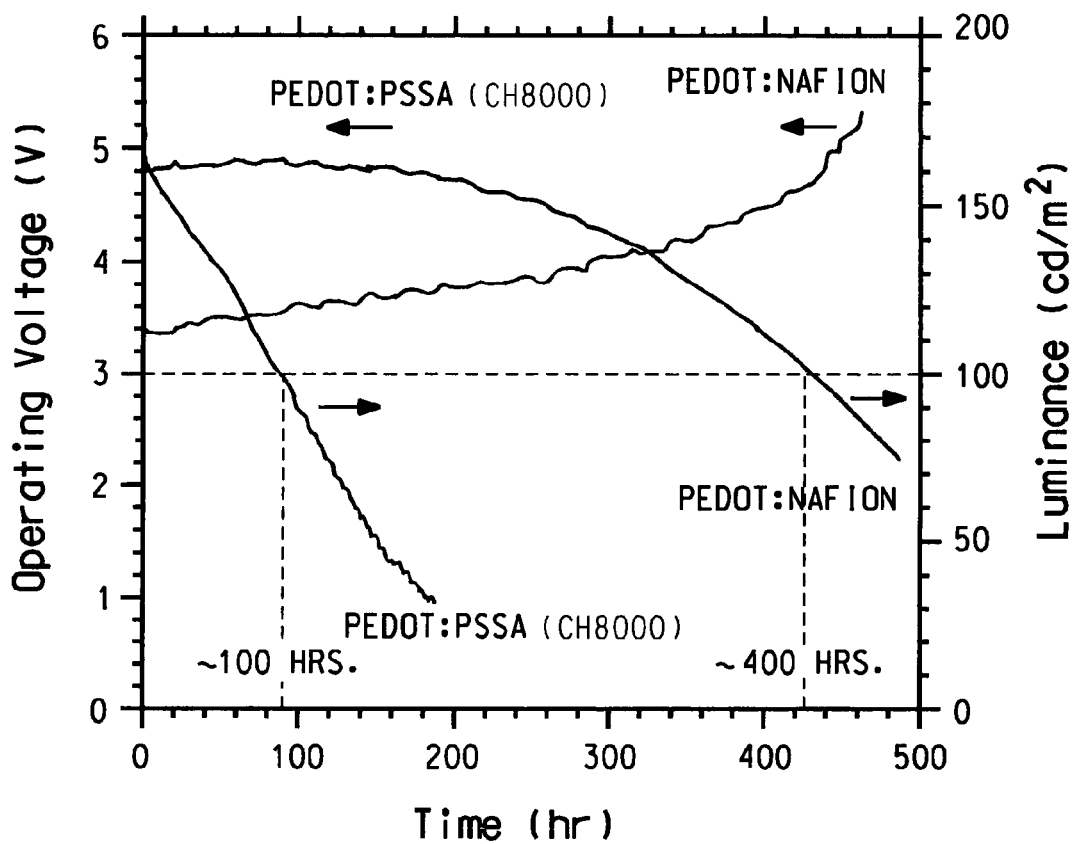
FIG. 6 illustrates the operation lifetime of OLED devices with red light-emitting polymers.
Figure 7:
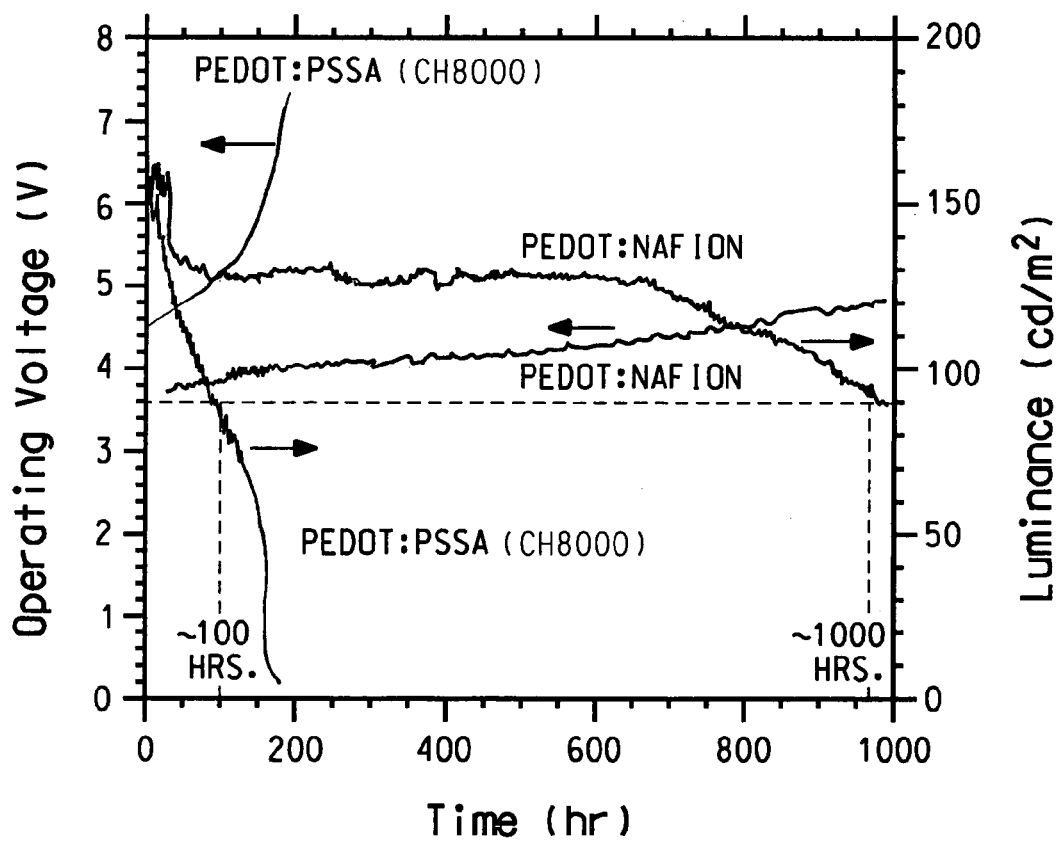
FIG. 7 illustrates the operation lifetime of OLED devices with blue light-emitting polymers.
Figure 8A:
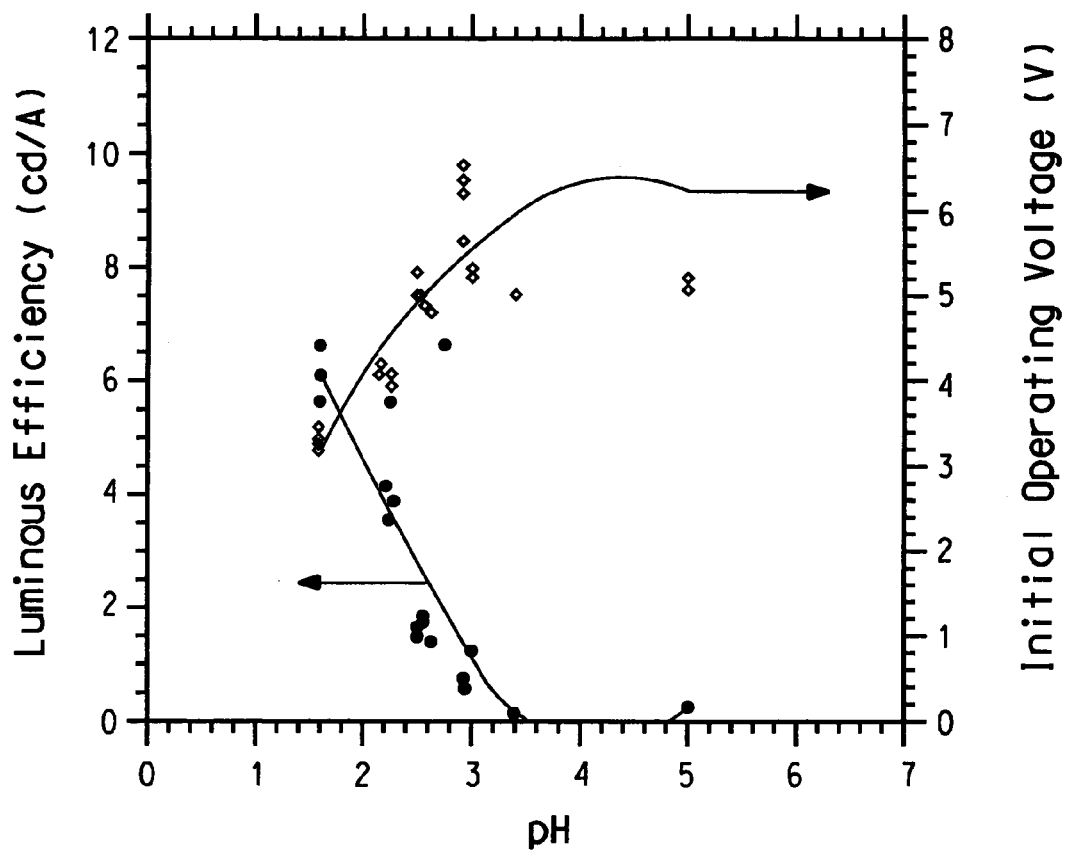
FIG. 8(a) through FIG. 8(d) illustrate the effect of the pH of the PEDT/PSSA buffer layer on OLED device performance.
Figure 8B:
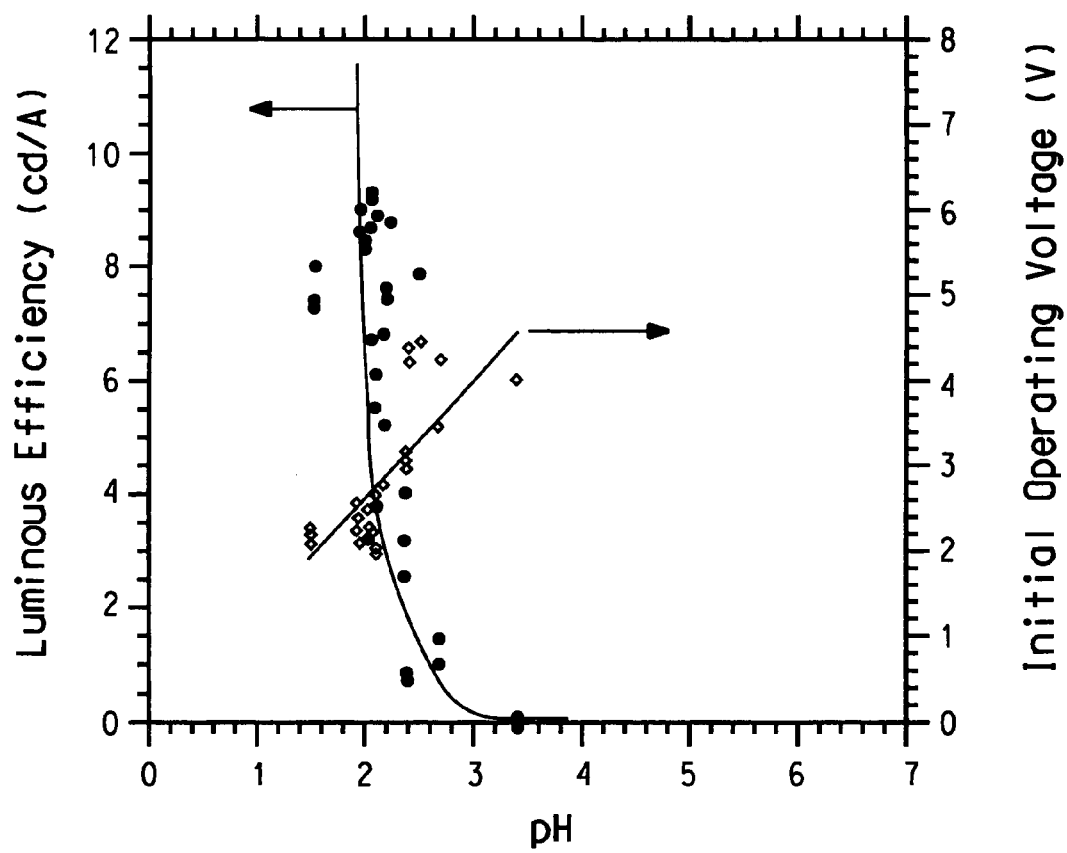
Figure 8C:
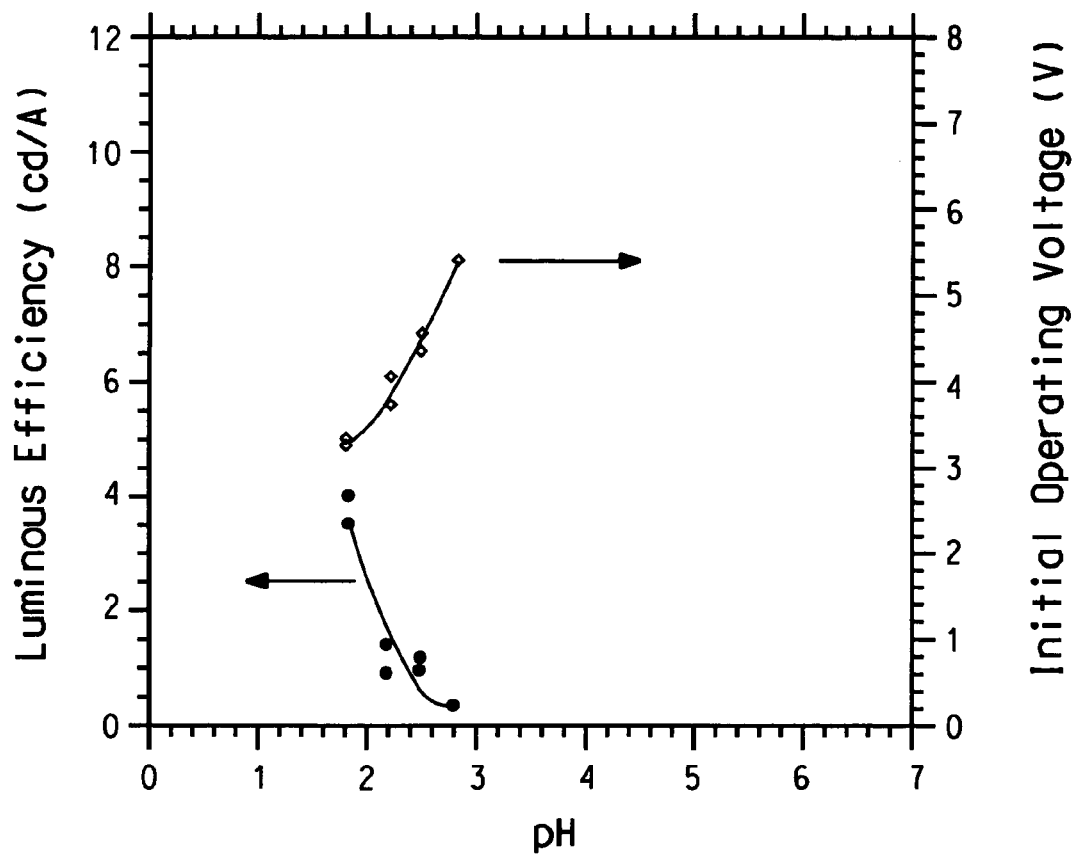
Figure 8D:
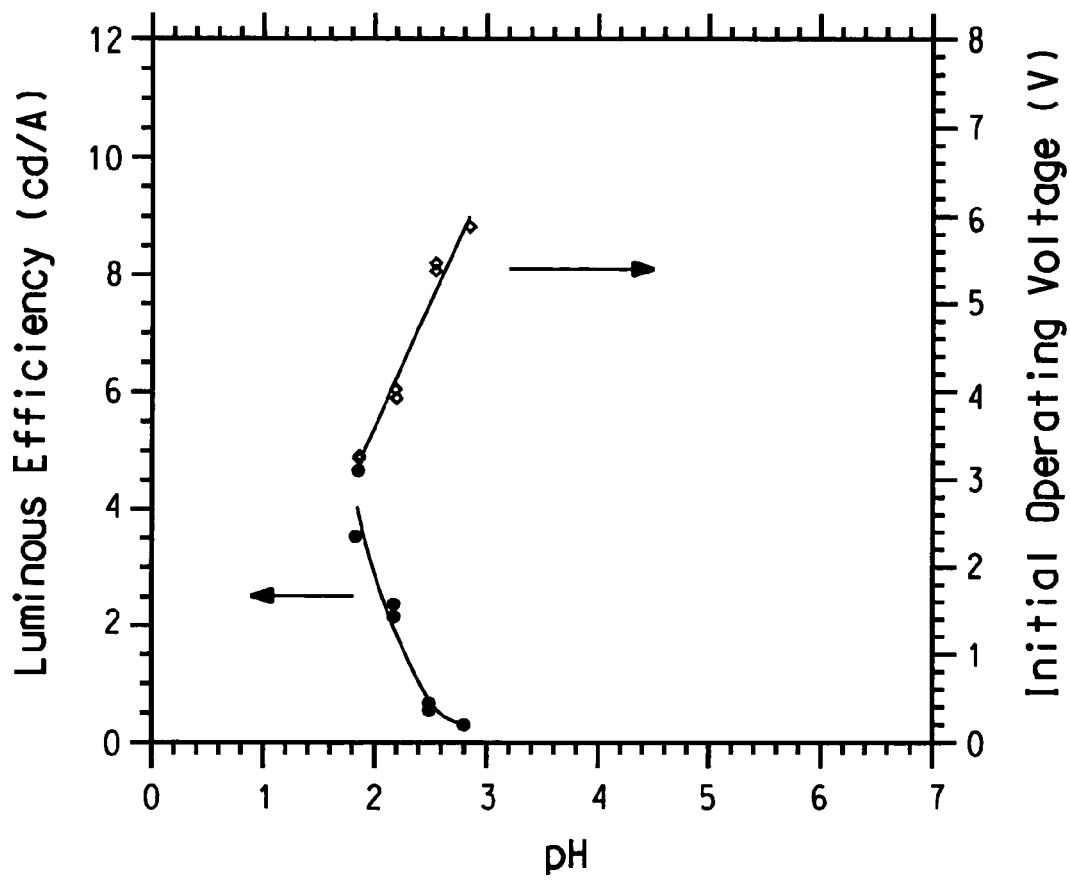
Figure 9A:
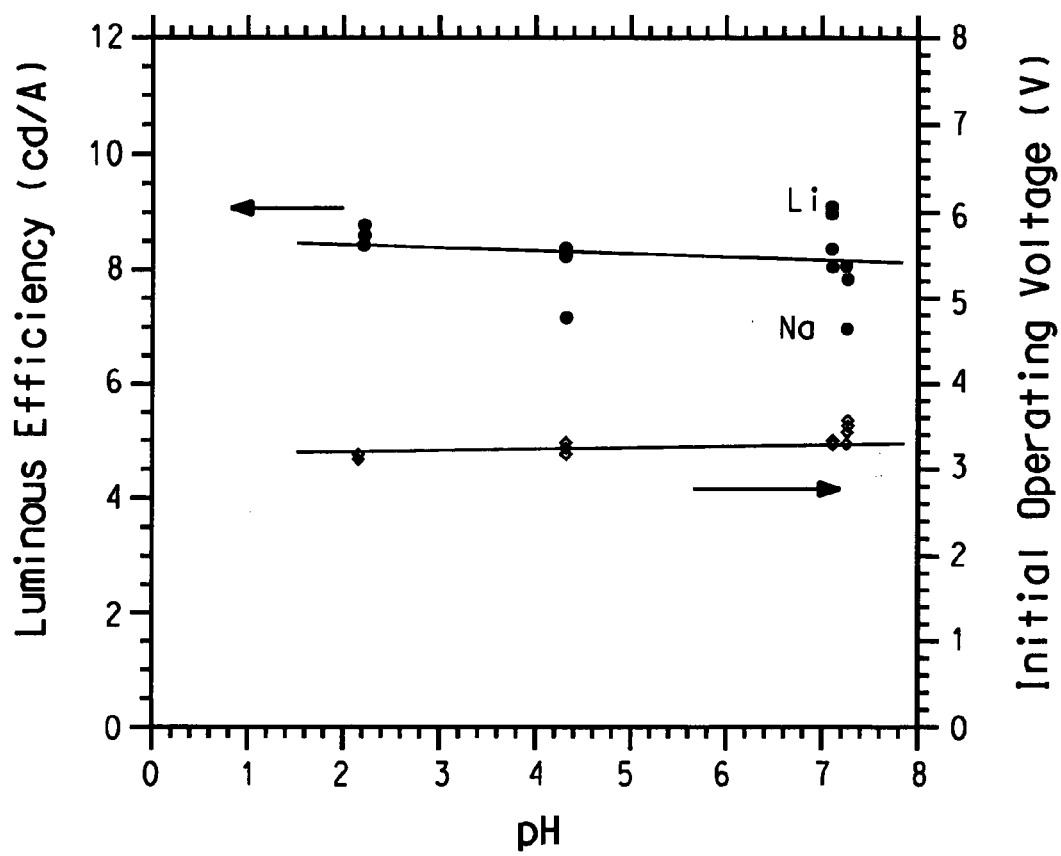
FIG. 9(a) through FIG. 9(c) illustrate the effect of the pH of the polythiophene/FSA aqueous colloidal dispersion buffer layer on OLED device performance.
Figure 9B:
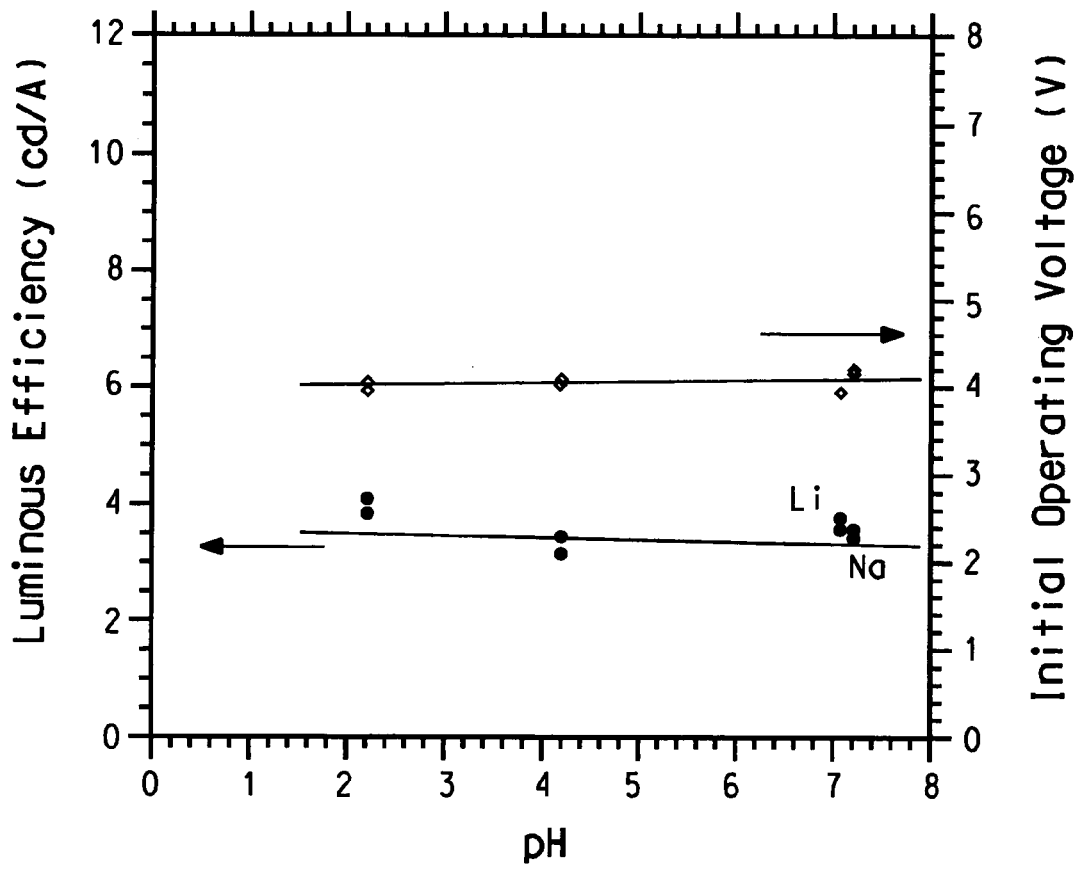
Figure 9C:
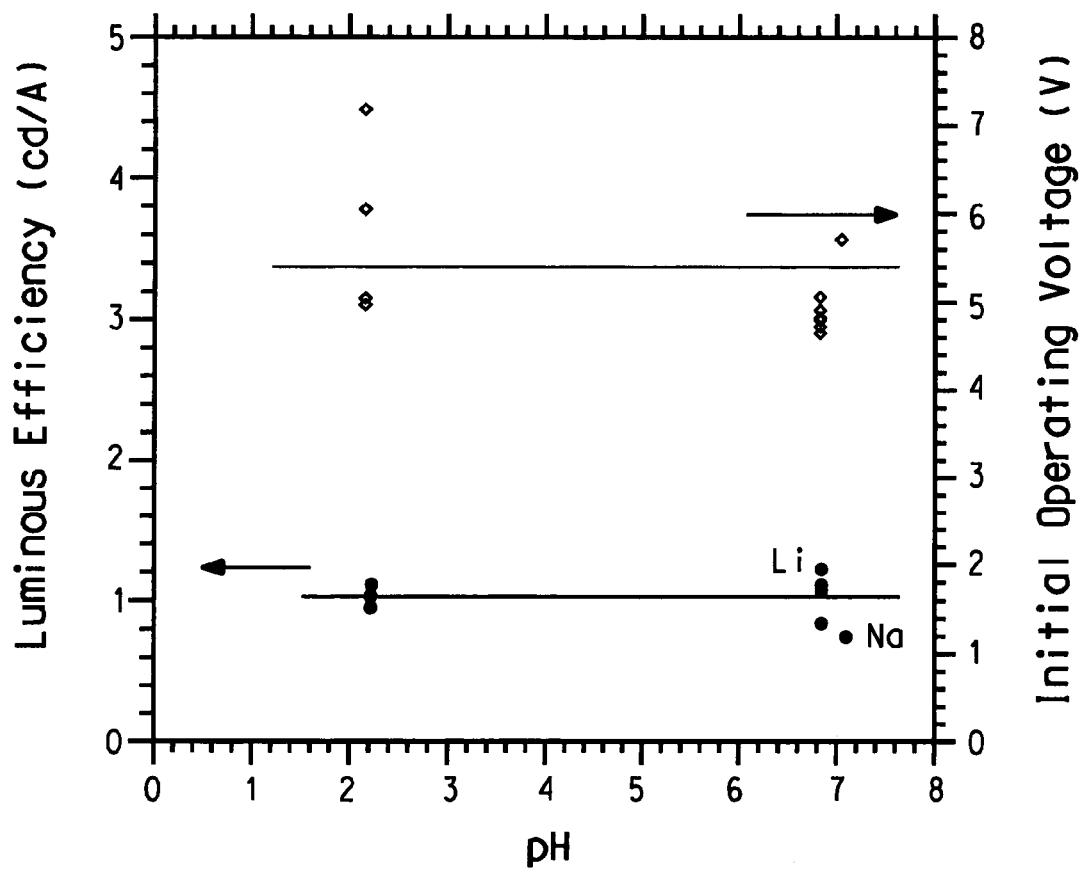
Figure 10:
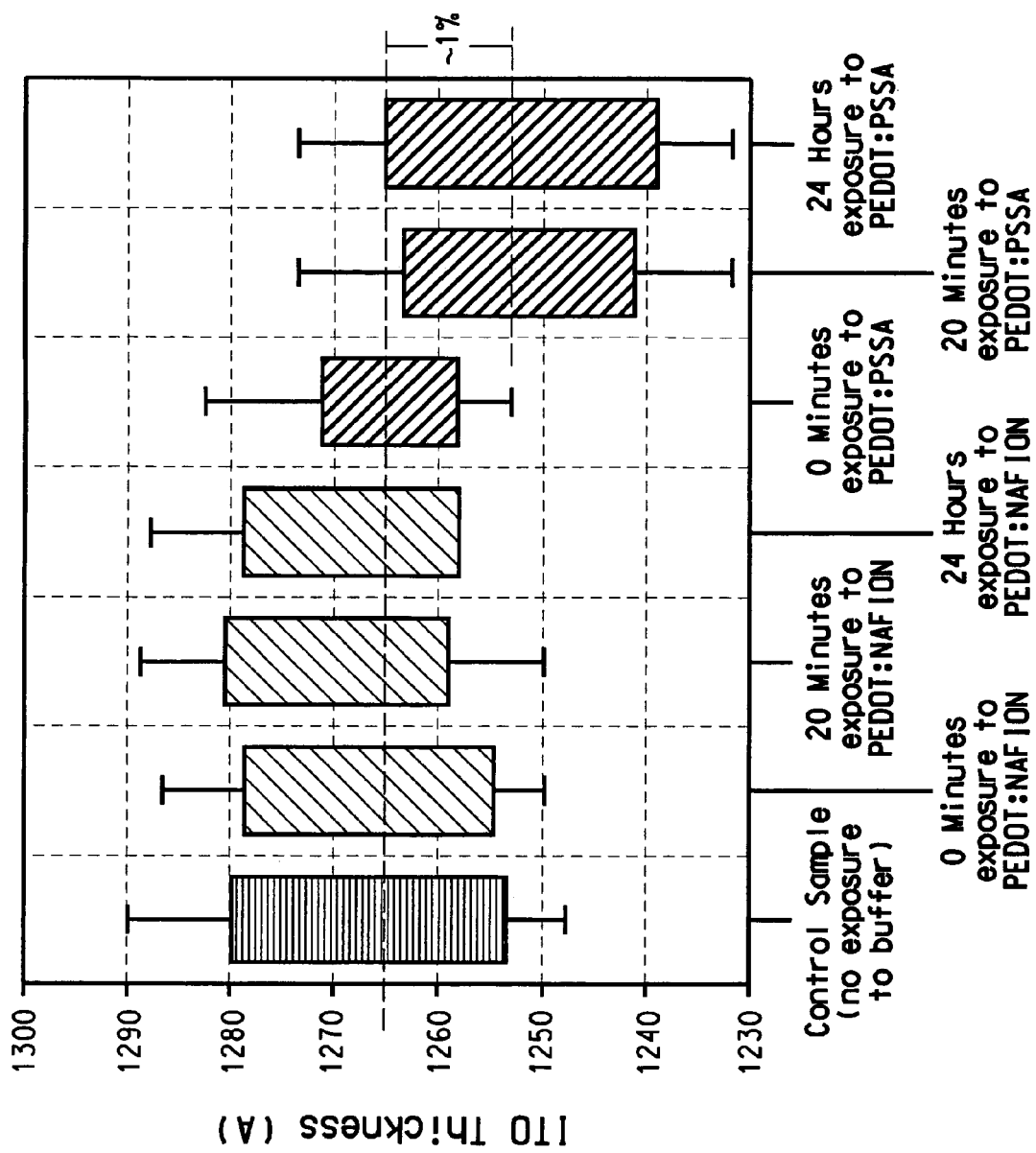
FIG. 10 illustrates the change in ITO thickness when immersed in dispersions of polythiophene/FSA aqueous colloidal dispersion or PEDT/PSSA.

Another illustration of a use for the new composition, is the thin film field effect transistors, is shown in FIG. 2. In this illustration, a dielectric polymer or dielectric oxide thin film 210 has a gate electrode 220 on one side and drain and source electrodes, 230 and 240, respectively, on the other side. Between the drain and source electrode, an organic semiconducting film 250 is deposited. New aqueous dispersions containing nanowires or carbon nanotubes are ideal for the applications of gate, drain and source electrodes because of their compatibility with organic based dielectric polymers and semiconducting polymers in solution thin film deposition. Since new compositions as a colloidal dispersion, less weight percentage of the conductive fillers is required (relative to compositions containing water soluble polymeric sulfonic acids) to reach percolation threshold for a desired or high electrical conductivity.

In another embodiment, there are provided field effect resistance devices comprising one layer comprising at least one polythiophene having Formula I(a) or Formula I(b) and at least one colloid-forming polymeric sulfonic acids. The field effect resistance devices undergo a reversible change of resistance in the conducting polymer films when subjected to a pulse of gate voltage, as illustrated in pages 339-343, No. 2, 2002, Current Applied Physics.

In another embodiment, there are provided electrochromic displays comprising at least one layer comprising at least one polythiophene having Formula I(a) or Formula I(b) and at least one colloid-forming polymeric sulfonic acids. Electrochromic displays utilize change of color when thin film of the material is subjected to electrical potential. In one embodiment electrically conductive polythiophene/polymeric acid colloids of the new composition are superior materials for this application because of the high pH of the dispersion, and the low moisture uptake and water non-dispersibility of dried solid films made from the dispersions.

In yet another embodiment, there are provided memory storage devices comprising silicon chips top-coated with a composition comprising at least one polythiophene having Formula I(a) or Formula I(b) and at least one colloid-forming polymeric sulfonic acids. For example, a write-once-read-many-times (WORM) memory is known in the arts (Nature, Page 166 to 169, vol 426, 2003). When information is recorded, higher voltages at certain points in the circuit grids of silicon chips destroys the polythiophene at those points to create "zero" bit data. The polythiophene at the untouched points remains electrically conductive and becomes "1" bit data.

In another embodiment, the new aqueous dispersions comprising at least one polythiophene having Formula I(a) or Formula I(b) and at least one colloid forming polymeric acid are used to form coatings for biosensor, electrochromic, andistatic, anti-corrosion, solid electrolyte capacitors, or electromagnetic shielding applications.

In another embodiment, the new compositions can be used for antistatic coatings for plastic and cathode ray tubes, electrode materials for solid electrolyte capacitors, metal anti-corrosion coatings, through-hole plating of printed circuit boards, photodiodes, bio-sensors, photodetectors, rechargeable batteries, photovoltaic devices, and photodiodes. In addition, examples of other applications for the new compositions can be found in, for example, Advanced Materials, page 490 to 491, vol. 12, No. 7, 2000.

In another embodiment, there are provided methods for producing, aqueous dispersions of polythiophene having Formula I(a) or Formula I(b) and at least one colloid-forming polymeric acid comprising polymerizing thiophene monomers having Formula II(a) or Formula II(b) in the presence of polymeric sulfonic acid colloids. The polymerization is carried out in the presence of water. The resulting reaction mixture can be treated with ion exchange resins to remove reaction byproducts and to adjust the pH of the dispersion. The new compositions and its uses will now be described in greater detail by reference to the following non-limiting examples.

EXAMPLES

Example 1

This Example illustrates polymerization of (sulfonic acid-propylene-ether-methylene-3,4-dioxyethylene)thiophene in the presence of Nafion®. A 25% (w/w) aqueous colloidal dispersion of perfluroethylenesulfonic acid with an EW of 990 is made using a procedure similar to the procedure in U.S. Pat. No. 6,150,426, Example 1, Part 2, except that the temperature is approximately 270° C. The dispersion is diluted with water to form a 12.5% (w/w) dispersion for the polymerization.

63.87 g (8.06 mmoles of Nafion® monomer units) Nafion® aqueous colloidal dispersion, and 234.47 g deionized water will be massed into a 500 mL jacketed three-necked round bottom flask. The mixture will be stirred for 45 minutes before the addition of ferric sulfate and sodium persulfate. A stock solution of ferric sulfate will be made first by dissolving 0.0141 g ferric sulfate hydrate (97%, Aldrich cat. #30,771-8) with deionized water to a total weight of 3.6363 g. 0.96 g (0.0072 mmoles) of the ferric sulfate solution and 0.85 g (3.57 mmoles) sodium persulfate (Fluka, cat. # 71899) will be then placed into the reaction flask while the mixture will be stirred. The mixture will then be stirred for 3 minutes prior to addition of 0.8618 g (2.928 mmoles) of (sulfonic acid-propylene-ether-methylene-3,4-dioxyethylene)thiophene monomer. The monomer will be added to the reaction mixture while stirring. The polymerization will be allowed to proceed with stirring at about 20° C. controlled by circulation fluid. The polymerization will be terminated in 16 hours by adding 8.91 g Lewatit® S100, a trade name from Bayer, Pittsburgh, Pa., for sodium sulfonate of crosslinked polystyrene, and 7.70 g Lewatit® MP62 WS, a trade from Bayer, Pittsburgh, Pa., for free base/chloride of tertiary/quaternary amine of crosslinked polystyrene. The two resins will be washed first before use with deionized water separately until there will be no color in the water. The resin treatment will proceed for 5 hrs. The resulting slurry will then be suction-filtered through a Whatman #54 filter paper.

Example 2

This Example illustrates polymerization of (propyl-ether-ethylene-3,4-dioxyethylene)thiophene in the presence of Nafion®. The Nafion® will be the same as in Example 1.

63.87 g (8.06 mmoles of Nafion® monomer units) Nafion® aqueous colloidal dispersion, and 234.47 g deionized water will be massed into a 500 mL jacketed three-necked round bottom flask. The mixture will be stirred for 45 minutes before the addition of ferric sulfate and sodium persulfate. A stock solution of ferric sulfate will be made first by dissolving 0.0141 g ferric sulfate hydrate (97%, Aldrich cat. #30,771-8) with deionized water to a total weight of 3.6363 g. 0.96 g (0.0072 mmoles) of the ferric sulfate solution and 0.85 g (3.57 mmoles) sodium persulfate (Fluka, cat. # 71899) will be then placed into the reaction flask while the mixture will be stirred. The mixture will then be stirred for 3 minutes prior to addition of 0.6685 g (2.928 mmoles) of (propyl-ether-ethylene-3,4-dioxyethylene)thiophene monomer. The monomer will be added to the reaction mixture while stirring. The polymerization will be allowed to proceed with stirring at about 20° C. controlled by circulation fluid. The polymerization will be terminated in 16 hours by adding 8.91 g Lewatit® S100, a trade name from Bayer, Pittsburgh, Pa., for sodium sulfonate of crosslinked polystyrene, and 7.70 g Lewatit® MP62 WS, a trade from Bayer, Pittsburgh, Pa., for free base/chloride of tertiary/quaternary amine of crosslinked polystyrene. The two resins will be washed first before use with deionized water separately until there will be no color in the water. The resin treatment will proceed for 5 hrs. The resulting slurry will then be suction-filtered through a Whatman #54 filter paper.

Example 3

This example illustrates slow injection of both ethylenedioxythiophene ("EDT") monomer and oxidizing agent solution into the reaction mixture containing iron(III) sulfate catalyst, water, Nafion® and HCl co-acid. The Nafion® used is the same as in Example 1.

In a 2000 mL reaction kettle are put 715 g of 12% solid content aqueous Nafion® dispersion (82 mmol $SO_3H$ groups), 1470 g water, 0.5 g (0.98 mmol) iron(III)sulfate ($Fe_2(SO_4)_3$), and 1406 µL of 37% HCl (18.1 mmol). The reaction mixture is stirred for 15 minutes at 200 RPM using an overhead stirrer fitted with a double stage propeller type blade before addition of 7.78 g (32.8 mmol) sodium persulfate ($Na_2S_2O_8$) in 60 mL of water, and 3.17 mL ethylenedioxythiophene (EDT). The addition is started from separate syringes using addition rate of 0.9 mL/h for $Na_2S_2O_8$/water and 50 µL/h for EDT while continuously stirring at 200 RPM. EDT addition is accomplished by placing the monomer in a syringe connected to a Teflon® tube that leads directly into the reaction mixture. The end of the Teflon® tube connecting the $Na_2S_2O_8$/water solution is placed above the reaction mixture such that the injection involves individual drops falling from the end of the tube such that the injection is gradual. The reaction is stopped 2 h after the addition of monomer has finished by adding 170 g of each Lewatit MP62WS and Lewatit Monoplus S100 ion-exchange resins, and 225 g of n-propanol to the reaction mixture and stirring it further for 4 h at 150 RPM. The ion-exchange resin is finally filtered from the solution using Whatman No. 54 filter paper. pH of the dispersion is 4 and dried films derived from the dispersion have conductivity of $1.4 \times 10^{-4}$ S/cm at room temperature.

Analysis by an Atomic Force Microscope (AFM) of films resulting from spin-coating dispersion onto ITO substrates revealed that all particulates in the film were smaller than 60 nm in height (multiple 50×50 µm scans). In comparison, films spun from dispersions made using procedures where all of the monomer is rapidly added in one portion, have large count of particles up to 200 nm tall and up to 500 nm wide.

Organic light emitting diodes (OLEDs) were fabricated to the following specifications: 6×6" substrates containing patterned indium-tin-oxide anodes, were cleaned in an oxygen plasma (300 W) for 10 minutes. Then approximately 75 nm thick film of the buffer was spun followed by baking at 130° C. on a hotplate for 10 minutes. After cooling down to room temperature, the plate was spun with approximately 75 nm thick film of Lumination Green 1303 electroluminescent polymer from Dow Chemicals (from 1% w/v solution in p-Xylene) in air. Following the baking of the electroluminescent film at 130° C. in a vacuum oven for 40 minutes, a cathode consisting of 4 nm of Ba and 500 nm of Al was thermally evaporated at pressure less then $10^{-6}$ Torr. Encapsulation of the devices was achieved by bonding a glass slide on the back of the devices using a UV-curable epoxy resin.

The resulting devices (16 devices total with 300 $mm^2$ active area) had efficiency of 19.2±0.5 cd/A @ 1000 cd/m2 at room temperature and a rectification ratio of 1000 at ±5V. Five devices were stressed with a constant current of 16.2 mA (approximately 900 cd/$m^2$) at 80° C. After 1000 h the light output had decreased on average by 32% or ~600 cd/$m^2$.

Example 4

This example illustrates slow injection of both EDT monomer and oxidizing agent solution into the reaction mixture containing iron(III) sulfate catalyst, water, Nafion® and $H_2SO_4$ co-acid. The Nafion® is the same as in Example 1.

In a 200 mL reaction kettle are put 715 g of 12% solid content aqueous Nafion®D (82 mmol $SO_3H$ groups) dispersion, 1530 g water, 0.5 g (0.98 mmol) iron(III)sulfate ($Fe_2(SO_4)_3$), and 1011 µL of concentrated $H_2SO_4$ (18.1 mmol). The reaction mixture is stirred for 15 min at 276 RPM using an overhead stirrer fitted with a double stage propeller type blade, before addition of 8.84 g (37.1 mmol) sodium persulfate ($Na_2S_2O_8$) in 60 mL of water, and 3.17 mL ethylenedioxythiophene (EDT) is started from separate syringes using addition rate of 4.2 mL/h for $Na_2S_2O_8$/water and 224 µL/h for EDT while continuously stirring at 276 RPM. The addition of EDT is accomplished by placing the monomer in a syringe connected to a Teflon® tube that leads directly into the reaction mixture. The end of the Teflon® tube connecting the $Na_2S_2O_8$/water solution was placed above the reaction mixture such that the injection involved individual drops falling from the end of the tube. The reaction is stopped 7 hours after the addition of monomer has finished by adding 170 g of each Lewatit MP62WS and Lewatit Monoplus S100 ion-exchange resins, and 225 g of n-propanol to the reaction mixture and stirring it further for 7 hours at 130 RPM. The ion-exchange resin is finally filtered from the dispersion using Whatman No. 54 filter paper. The pH of the dispersion is ~4 and dried films derived from the dispersion have conductivity of $2.6 \times 10^{-5}$ S/cm at room temperature.

Organic light emitting diodes (OLEDs) are fabricated to the following specifications: 6×6" substrates containing patterned indium-tin-oxide anodes partially covered with 600 nm thick photo-resist for device area definition, were cleaned in an UV-Ozone oven for 10 min. Then approximately 75 nm thick film of the buffer layer from the PEDOT/Nafion® made above is spun followed by baking at 130° C. on a hotplate for 10 min. After cooling down to room temperature, the plate is spun with approximately 75 nm thick film of Lumination Green 1303 electroluminescent polymer from Dow Chemicals (from 1% w/v solution in p-xylene) in air. Following the baking of the electroluminescent film at 130° C. in a vacuum oven for 40 min, a cathode consisting of 4 nm of Ba and 500 nm of Al is thermally evaporated at pressure less than $10^{-6}$ Torr. Encapsulation of the devices is achieved by bonding a glass slide on the back of the devices using a UV-curable epoxy resin.

The resulting devices (25 mm² active area) have an efficiency of 20±1 cd/A @ 1000 cd/m² and a rectification ratio of 13000 @±5V. Six devices are stressed with a constant current of 50 mA/cm² (approximately 8,000 cd/m²) at 25° C. In 220 h the luminance drops to half the initial value.

Example 5

This example illustrates the effect of the addition of ethylene glycol on the conductivity of as-synthesized PEDOT/Nafion®:

An aqueous PEDT/Nafion®, used for this example was prepared as follows:

0.309 ml (2.902 mmoles) of Baytron-M (a trade name for 3,4-ethyylenedioxythiophene) from H. C. Starck GmbH (Leverkusen, Germany) was predissolved in 229.12 g deionized water at 20° C. for one hour in a 500 ml jacketed three-necked round bottom flask equipped with a stirrer at a speed of 175 RPM. 69.52 g (8.0 mmoles of Nafion® monomer units) DE1021 (E. I. du Pont de Nemours and Company (Wilmington, Del., USA; EW: 999 g/mole acid) Nafion® was then massed into the mixture. As soon as the Nafion® was added, 0.84 g (3.538 mmoles) sodium persulfate pre-dissoved in 10 g deionized water was added to the reaction vessel. 0.95 g (7.1 mmoles) of a stock solution of ferric sulfate was then added. The stock solution of ferric sulfate was made first by dissolving 0.0141 g ferric sulfate hydrate (97%, Aldrich cat. #30, 771-8) with deionized water to a total weight of 3.6363 g. The polymerization was allowed to proceed with stirring at about 20° C. controlled by circulation fluid. The polymerization liquid started to turn blue in 13 minutes. The reaction was terminated in 14 hours by adding 11.03 g Lewatit® S100, a trade name from Bayer, Pittsburgh, Pa., for sodium sulfonate of crosslinked polystyrene, and 11.03 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for about 6 hrs. The resulting slurry was then suction-filtered through a Whatman #54 filter paper. It went through the filter paper very fast. Yield was 268 g. Solid % was about 2.8% (w/w) based on added polymerization ingredients. pH of the aqueous PEDT/Nafion® was determined to be 4.64 with a 315 pH/Ion meter from Corning Company (Corning, N.Y., USA).

A couple drops of the dispersion made above were spread on a microscope slide, which was left dried in ambient conditions before placed in a vacuum oven set at 90° C. for 30 minutes. The oven was constantly fed with a small amount of flowing nitrogen. Once baked, the dried films having thickness of ~2 µm were painted with approximately 0.4 cm parallel vertical lines with a separation of about 0.15 cm between each two parallel lines. The thickness was measured using a Surface Profiler (model# Alpha-Step 500, from Tencor Instrument, San Jose, Calif., USA). Resistance was then measured at ambient temperature by applying voltage between 1 and −1 volt using a Keithley 2420 Source Meter. Average conductivity of five samples was $1.1 \times 10^{-5}$ S/cm. It should be pointed out that the films used for resistance measurement do not re-disperse in water. 9.5021 g of the aqueous dispersion, which contains 0.266 g solid and 9.2361 g water, was mixed with 0.499 g ethylene glycol (Across Organics, Cat# 295530010) and stirred for 3 hours. It formed a smooth dispersion, which contains 2.7% (w/w) PEDOT/Nafion®, and 5.0% (w/w) ethylene glycol. Couple drops of the dispersion made above were spread on a microscope slide. The films left dried on a hot plate set at ~50° C. in ambient conditions before placed in a vacuum oven set at 90° C. for 50 minutes. The oven was constantly fed continuously with a small amount of flowing nitrogen. Once baked, the dried films having thickness of ~6 µm were painted with approximately 0.4 cm parallel vertical lines with a separation of about 0.15 cm between each two parallel lines. Resistance was then measured at ambient temperature by applying voltage between 1 and −1 volt. Average conductivity of four samples was $2.9 \times 10^{-4}$ S/cm. The conductivity is about 30 times the conductivity of the films made from as-synthesized PEDOT/Nafion®.

7.9981 g of the aqueous dispersion, which contains 0.2239 g solid and 7.7742 g water, was mixed with 2.0154 g ethylene glycol (Across Organics, Cat# 295530010) and stirred for 3 hours. It formed a smooth dispersion which contains 2.2% (w/w) PEDOT/Nafion® and 20.1% (w/w) ethylene glycol. Films preparation and resistance are as described for 5% ethylene glycol. Once baked, the dried films having thickness of ~3 µm were painted with approximately 0.4 cm parallel vertical lines with a separation of about 0.152 cm between each two parallel lines. Resistance was then measured at ambient temperature by applying voltage between 1 and −1 volt. Average conductivity of four samples was $4.6 \times 10^{-4}$ S/cm. The conductivity is about 46 times the conductivity of the films made from as-synthesized PEDOT/Nafion®.

Example 6

This example illustrates one ink-jetting application of PEDOT/Nafion® with added ethylene glycol:

The preparation of one of the four large batches (1,700 g) of aqueous PEDOT/Nafion® dispersion, which was combined for microfluidization for particle size reduction, is described below. The Nafion® used for the polymerization is the same as in Example 1 with an EW of 1050.

366.1 g (46.13 mmoles of Nafion® monomer units) Nafion® aqueous colloidal dispersion, and 1693.7 g deionized water was massed into a 2000 ml jacketed three-necked round bottom flask. The mixture was stirred for 2 hrs at a stirring speed of 425 RPM before the addition of ferric sulfate and sodium persulfate. A stock solution of ferric sulfate was made first by dissolving 0.1017 g ferric sulfate hydrate (97%, Aldrich cat. #30,771-8) with deionized water to a total weight of 19.4005 g. 4.07 g (0.0413 mmoles) of the ferric sulfate solution and 4.88 g (40.99 mmoles) sodium persulfate (Fluka, cat. #71899) were then placed into the reaction flask while the mixture was being stirred. The mixture was then stirred for 4 minutes prior to addition of 1.790 ml (16.796 mmoles) of Baytron-M (a trade name for 3,4-ethyylenedioxythiophene H. C. Starck, LeverKusen, Germany) was added to the reaction mixture while stirring. The polymerization was allowed to proceed with stirring at about 20° C. controlled by circulation fluid. The polymerization liquid started to turn blue in 13 minutes. The reaction was terminated in 7 hours by adding 44.17 g Lewatit® S100, a trade name from Bayer, Pittsburgh, Pa., for sodium sulfonate of crosslinked polystyrene, and 48.80 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for 5 hrs. The resulting slurry was then suction-filtered through a Whatman #54 filter paper. It went through the filter paper very fast. Solid % was about 3.0% (w/w). Four batches made in the same manner as described above were combined and microfluidized with a Microfluidizer Processor M-110Y (Microfluidics, Massachusetts, USA) using a pressure of 5,000-7,000 psi for five passes. The diameter of first pressure chamber and second pressure chamber is 200 µm (H30Z model).

Viscosity and surface tension are two most critical physical properties for ink-jet printing. They effect drop formation, jet stability, substrate wetting, spreading and leveling as well as drying phenomena. Viscosity of the 3% PEDOT/Nafion® is about 1.9 cp at 60 rpm and the viscosity of 1% is about 0.9 cp at 60 rpm. The obtained printing surface is not very smooth. The viscosity is too low and the surface tension is too high for effective ink-jet printing. Therefore, ethylene glycol was added as described below, which should improve conductivity as demonstrated in Example 5, increase viscosity, lower the surface tension of PEDOT/Nafion®.

8.0 ml (density ~1.008 g/ml) of the microfluidized aqueous dispersion was added with 14 ml deionized water and 4.0 ml ethylene glycol (density ~1.113 g/ml; Acros Organics, Cat# 295530010). The composition contains 0.91% (w/w) PEDOT/Nafion®, 16.9% ethylene glycol. The ink was filtered through HV filter after mixed well. Viscosity of the ink was measured to be 2.45 cps at 60 rpm.

Microfab (single-nuzzle system) was used for ink-jet printing. A 30 um tip was back-flushed with DI water and blow-dried with N2. The ink-jetting head was set-up, and a stable and clean drop was obtained using 15 volts with 45 us dwell time. A full-drizzle 1 um undercut plate (5206) was treated with UV-Ozone for 15 minutes, then treated with CF4 plasma for 3 minutes. The plate was placed at the printing stage at room temperature. Display 1, 2, 3, 4 were printed. For Display 1, Row 1 to Row 5 were printed with 7 drops per pixel, R6 to R 10 were printed with 8 drops per pixel, R16 to R 20 were printed with 9 drops per pixel, and R 21 to R 25 were printed with 10 drops per pixel. For Display 4, R11 to R15 were printed with 11 drops per pixel, R21 to R25 were printed 12 drops per pixel, R26 to R 30 were printed 13 drops per pixel, and R 31 to R 35 were printed with 14 drops per pixel. Then the plate was heated to 40° C., Display 5, 6, and 7 were printed with 8 drops, 10 drops, 12 drops per pixel, respectively. The plate after printed was baked at 130C under vacuum for 30 minutes.

0.91% PEOT/Nafion® with 16.9% ethylene glycol added gave higher viscosity (2.45 cps at 60 rpm) than that of 1% PEDOT/Nafion® aqueous ink (0.9 cps at 60 rpm). 0.91% PEDOT/Nafion®/EG ink gave better printability than 1% aqueous Nafion® aqueous system. Stable and clean drops without satellites were obtained easily with low voltage (15 v). Nuzzle stability was also improved by adding 16.9% ethylene glycol. Smooth surface was obtained with PEDOT/Nafion®/EG ink.

Example 7

This Example illustrates the preparation of an aqueous dispersion of PEDT/Nafion® and the effect of the addition of methanol on electrical conductivity and particle size.

73.46 g (8.81 mmoles) Nafion® aqueous colloidal dispersion and 224.8 g deionized water was massed into a 500 ml jacketed three-necked round bottom flask. Nafion® DE1020 (a commercial perfluoroethylenesulfonic acid from E. I. du Pont de Nemours and Company, Wilmington, Del.) was an 11.4% (w/w) aqueous colloidal dispersion having an EW of 951 g/acid equivalent. The mixture was allowed to stir for 20° C. for 30 minutes. 0.469 ml (4.40 mmoles) of Baytron-M (a trade name for 3,4-ethyylenedioxythiophene from H.C. Starck, MA, USA) was added to the Nafion®/water mixture and was allowed to stir for 15 more minutes before addition of ferric sulfate and sodium persulfate. 1.10 g (4.62 mmoles) sodium persulfate (Fluka, cat. # 71899) was first dissolved in 5 g deionized water in a glass vial and then transferred to the ration mixture while the mixture was being stirred. A stock solution of ferric sulfate was made first by dissolving 0.0141 g ferric sulfate hydrate (97%, Aldrich cat. #30,771-8) with deionized water to a total weight of 3.6363 g. 1.44 g (0.0108 mmoles) of the ferric sulfate stock solution added to the reaction flask immediately after the addition of the ferric sulfate solution. The polymerization was allowed to proceed with stirring at about 20° C. controlled by circulation fluid. The polymerization liquid started to turn blue in 13 minutes. The reaction was terminated in 12 hours by adding 9.61 g Lewatit® S100, a trade name from Bayer, Pittsburgh, Pa., for sodium sulfonate of crosslinked polystyrene, and 9.61 g Lewatit® MP62 WS, a trade from Bayer, Pittsburgh, Pa., for free base/chloride of tertiary/quaternary amine of crosslinked polystyrene. The two resins were washed first before use with deionized water separately until there was no color in the water. The resin treatment proceeded for 10 hrs. The resulting slurry was then suction-filtered through a Buchner Funnel containing two pieces of Whatman #4 filter paper. It went through the filter paper very fast. Yield was 290 g. Solid % was about 3.0% (w/w) based on added polymerization ingredients. pH of the aqueous PEDT/Nafion® was determined to be 4.95 with a 315 pH/Ion meter from Corning Company (Corning, N.Y., USA). Electrical conductivity of the as-made dispersion was determined to be $2.6 \times 10^{-6}$ S/cm using a two-probe resistance measurement technique. A small portion of the dispersion was added with 10% (w/w) methanol. Conductivity was determined to be $3.8 \times 10^{-6}$ S/cm, which shows that conductivity remains similar with addition of the methanol. However, the effect on particle size count, measured with an Accusizer (Model 780A, Particle Sizing Systems, Santa Barbara, Calif.), is pronounced as illustrated in Table I, which shows number of particles per one mL dispersion, which have particle size greater than 0.75 µm, 1.51 µm, and 2.46 µm, respectively. The data clearly shows that methanol not only stabilizes the PEDT/Nafion® particles, but also reduces number of large particles substantially.

TABLE 1

| Methanol (10%) | >0.75 µm | >1.51 µm | >2.46 µm |
|---|---|---|---|
| Without (As-made) | 355,488 | 57,448 | 17,983 |
| Without (14 days) | 400,122 | 69,948 | 21,849 |
| With (3 hr) | 262,795 | 38,816 | 10,423 |
| With (27 hr) | 245,573 | 34,586 | 9,477 |
| With (14 days) | 18,864 | 8,252 | 4,233 |

Example 8

This Example illustrates the preparation of an aqueous dispersion of PEDT/Nafion® and the effect of the addition of n-propanol on particle size. The Nafion® used was the same as in Example 1.

In a 500 mL reaction kettle are put 85.9 g of 12% solid content aqueous Nafion® dispersion (9.8 mmol $SO_3H$ groups), 313 g water, 1.86 g (7.8 mmol) sodium perisulfate ($Na_2S_2O_8$), and 0.084 g (0.125 mmol) iron(III)sulfate ($Fe_2(SO_4)_3$). The reaction mixture is stirred for 15 min at 180 RPM using a propeller type blade before addition of 0.695 mL (6.5 mmol) ethylenedioxythiophene (EDT) is started using addition rate of 20 µL/h while continuously stirring at 180 RPM.

The addition of EDT is accomplished by placing the monomer in a syringe connected to a Teflon® tube that leads directly into the reaction mixture. The reaction is stopped 36 h after the addition of monomer has finished by adding 25 g of each Lewatit MP62WS and Lewatit Monoplus S100 ion-exchange resins to the reaction mixture and stirring for 3 h at 180 RPM. The ion-exchange resin is finally filtered from the solution using Whatman No. 54 filter paper. Portion of the dispersion is diluted by 10% w/w with n-propanol. After 60 h, particle count, measured an Accusizer (Model 780A, Particle Sizing Systems, Santa Barbara, Calif.), of PEDT/Nafion® particles of the dispersion prior to and after addition of n-propanol is shown in Table II and FIG. 1. The data clearly shows that n-propanol, a low boiling liquid, has reduced the number of large PEDT/Nafion® particles substantially.

TABLE 2

| n-Propanol (10%) | >0.75 μm | >1.51 μm | >2.46 μm |
|---|---|---|---|
| Without | 2,430,000 | 593,000 | 100,000 |
| With | 211,000 | 33,000 | 8000 |

Example 9

This Example illustrates preparation of an aqueous dispersion of PEDT/Nafion®. The Nafion® used was the same as in Example 1.

63.89 g (8.07 mmoles of Nafion® monomer units) Nafion® (990 EW) aqueous colloidal dispersion (12.5%, w/w) and 234.79 g deionized water was massed into a 500 ml jacketed three-necked round bottom flask. The mixture was stirred for 45 minutes before addition of ferric sulfate and sodium persulfate. A stock solution of ferric sulfate was made first by dissolving 0.0135 g ferric sulfate hydrate (97%, Aldrich cat. #30,771-8) with deionized water to a total weight of 3.5095 g. 0.97 g (0.0072 mmoles) of the ferric sulfate solution and 0.85 g (3.57 mmoles) sodium persulfate (Fluka, cat. # 71899) were then placed into the reaction flask while the mixture was being stirred. The mixture was then stirred for 3 minutes prior to addition of 0.312 ml (2.928 mmoles) of Baytron-M (a trade name for 3,4-ethylene dioxythiophene from Bayer, Pittsburgh, Pa.) to the reaction mixture while stirring. The polymerization was allowed to proceed with stirring at about 20° C. controlled by circulation fluid. The polymerization liquid turned medium dark blue in half an hour. The reaction was terminated after 19.6 hours by adding 8.97 g Lewatit® S100 (a trade name from Bayer, Pittsburgh, Pa., for sodium sulfonate of crosslinked polystyrene) and 7.70 g Lewatit® MP62 WS (a trade from Bayer, Pittsburgh, Pa., for free base/chloride of tertiary/quaternary amine of crosslinked polystyrene). The two resins were washed first before use with deionized water separately until there was no color in the water. The resin treatment was allowed to proceed for 5 hrs. The resulting slurry was then suction-filtered through a Whatman #54 filter paper. It went through the filter paper readily. The yield was 273.7 g. The solid % was about 3.1% (w/w) based on added polymerization ingredients.

Example 10

This example illustrates the effect of added co-dispersing liquid on the surface tension of the PEDT/Nafion® dispersion.

The surface tension of the aqueous PEDT/Nafion® from Example 9, without any co-dispersing liquid, was measured with a FTA T10 Tensiometer Model 1000 IUD (KSV Instruments, Finland) and determined to be 73 milliN/meter at 19.5° C.

To determine effect of the co-dispersing liquid on the surface tension, 25.436 ml of the PEDT/Nafion® from Example 1 was mixed with 1.4781 ml n-propanol (n-PA) and 2.051 ml 1-methoxy-2-propanol (1M2P), which constitutes 87.8 V.% PEDT/Nafion®, 5.1 V.% n-PA, and 7.1 V.% 1M2P. The mixture of dispersion and co-dispersing liquid was very smooth having no indication of precipitation. The surface tension of the dispersion with co-dispersing liquid was determined to be 42.24 mN/m. The lower surface tension of the new dispersion indicates its increased wetability and ease of coating.

Example 11

This example illustrates effect of co-dispersing liquids on light emitting diode performance.

Figure 11:
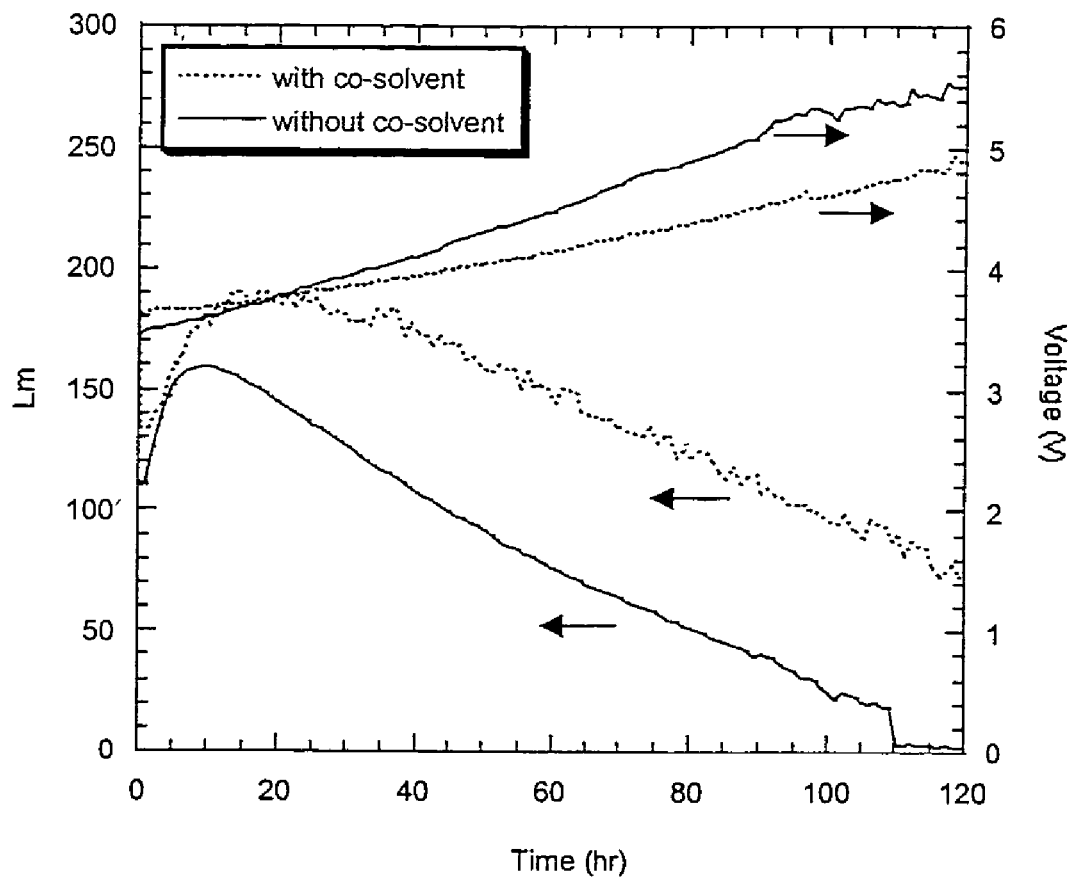
FIG. 11 illustrates a device luminance and voltage as a function of time.

The aqueous PEDT/Nafion® dispersion prepared in Example 9 and the co-dispersing liquid mix described in Example 10 were tested for light emission properties. The glass/ITO substrates (30 mm×30 mm) having ITO thickness of 100 to 150 nm and 15 mm×20 mm ITO area for light emission were cleaned and subsequently treated with oxygen plasma. The aqueous PEDT/Nafion® dispersions with and without the co-dispersing liquids were spin-coated onto the ITO/glass substrates. The thickness was 75 nm for both with and without the dispersing liquids. The PEDT/Nafion® coated ITO/glass substrates were dried in vacuum at 90° C. for 30 minutes. The PEDT/Nafion® layer was then top-coated with HS670 blue emitting polymer from Covion Organic Semiconductors GmbH (Frankfurt, Germany). The thickness of the EL layer was approximately 75 nm. The film thickness was measured with a TENCOR 500 Surface Profiler. The HS670 top-coated structure was then baked at 100° C. for 10 minutes in vacuum. Ba and Al layers were vapor deposited on top of the EL layers under a vacuum of $1\times10^{-6}$ torr. The final thickness of the Ba layer was 30 Å; the thickness of the Al layer was 4000 Å. The devices made from PEDT/Nafion® with the co-dispersing liquids have a higher efficiency (6.0 Cd/A) than the devices made without the co-dispersing liquids in the aqueous PEDT/Nafion® (4.5 Cd/A) although they have similar voltage (~4.2 volt). Device luminance and voltage as a function of time are shown in FIG. 11. The devices made with the new dispersions, which contain a co-dispersing liquid, have a longer half-life at 80° C. (100 hrs) than the devices made from dispersions of aqueous PEDT/Nafion® alone (50 hrs.).

While the invention has been described in detail with reference to certain preferred embodiments thereof, it will be understood that modifications and variations are within the spirit and scope of that which is described and claimed.

What is claimed is:

1. An electrically conductive composition comprising an aqueous dispersion capable of forming a film of at least one polythiophene and at least one colloid-forming fluorinated polymeric sulfonic acid, wherein said polythiophene has Formula I(a):

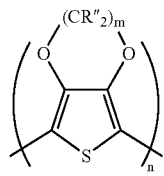

wherein:
R″ is the same or different at each occurrence and is selected from the group consisting of hydrogen, alkyl, heteroalkyl, alkenyl, heteroalkenyl, alcohol, amidosulfonate, benzyl, carboxylate, ether, ether carboxylate, ether sulfonate, sulfonate, and urethane, with the proviso that at least one R″ is not hydrogen,
m is 2 or 3, and
n is at least about 4.

2. A composition according to claim 1, wherein at least about 50% of the total number of halogen and hydrogen atoms in said fluorinated polymeric acid are fluorine atoms.

3. A composition according to claim 2, also comprising sulfonic acid salt groups.

4. A composition according to claim 1, wherein said fluorinated polymeric sulfonic acid is perfluorinated.

5. A composition according to claim 4, also comprising sulfonic acid salt groups.

6. A composition according to claim 1, further comprising at least one additional material selected from polymers, conductive polymers, colloid-forming polymeric acids, dyes, carbon nanotubes, metal nanowires, metal nanoparticles, carbon nanoparticles, carbon fibers, carbon particles, graphite fibers, graphite particles, coating aids, organic conductive inks, organic conductive pastes, inorganic conductive inks, inorganic conductive pastes, charge transport materials, semiconductive inorganic oxide nano-particles, insulating inorganic oxide nano-particles, piezoelectric nano-particles, pyroelectric nano-particles, ferroelectric oxide nano-particles, piezoelectric polymers, pyroelectric polymers, ferroelectric oxide polymers, photoconductive oxide nanoparticles, photoconductive oxide polymers, dispersing agents, crosslinking agents, and combinations thereof.

7. A composition according to claim 1, further comprising at least one co-dispersing liquid.

8. A composition according to claim 7, wherein the co-dispersing liquid is selected from the group consisting of ethers, cyclic ethers, alcohols, alcohol ethers, ketones, nitriles, sulfides, sulfoxides, amides, amines, carboxylic acids, and combinations thereof.

9. A composition according to claim 7, wherein the co-dispersing liquid is at least one liquid selected from the group consisting of n-propanol, isopropanol, methanol, butanol, 1-methoxy-2-propanol, dimethylacetamide, n-methyl pyrrozole, 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, 1-methylpyrrolidine, 1-methyl-2-pyrrolidinone, dimethylsulfoxide, and combinations thereof.

10. A composition according to claim 1, also comprising sulfonic acid salt groups.

11. A composition according to claim 1, wherein the sulfonic acid has a functional group represented by the formula,

—SO$_3$X wherein X is selected from the group consisting of H, Li, Na, K, and N(R$_1$)(R$_2$)(R$_3$)(R$_4$) where R$_1$, R$_2$, R$_3$, and R$_4$ are the same or different and selected from the group consisting of H, —CH$_3$, or —CH$_2$CH$_3$, and a metal, represented by the formula M$^{n+}$ where the number of functional groups is equal to the valence value of n.

* * * * *